US012751176B2

(12) United States Patent
Shin et al.

(10) Patent No.: US 12,751,176 B2
(45) Date of Patent: Sep. 29, 2026

(54) DISPLAY DEVICE HAVING IMPROVED HOLE INJECTION STRUCTURE VIA THE PIXEL ELECTRODE AND METHOD OF MANUFACTURING THE SAME

(71) Applicant: Samsung Display Co., LTD., Yongin-si (KR)

(72) Inventors: Hyun Eok Shin, Yongin-si (KR); Sung Joo Kwon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 421 days.

(21) Appl. No.: 18/375,655

(22) Filed: Oct. 2, 2023

(65) Prior Publication Data

US 2024/0215380 A1 Jun. 27, 2024

(30) Foreign Application Priority Data

Dec. 23, 2022 (KR) ........................ 10-2022-0183390

(51) Int. Cl.
*H10K 59/80* (2023.01)
*H10K 59/12* (2023.01)
*H10K 59/122* (2023.01)

(52) U.S. Cl.
CPC ... *H10K 59/80517* (2023.02); *H10K 59/1201* (2023.02); *H10K 59/122* (2023.02)

(58) Field of Classification Search
CPC ....... H10K 59/80517; H10K 59/80518; H10K 71/00
See application file for complete search history.

(56) References Cited

U.S. PATENT DOCUMENTS

| | | | | |
|---|---|---|---|---|
| 11,348,983 | B1 | 5/2022 | Choung et al. | |
| 2014/0361261 | A1* | 12/2014 | Choi | H10K 59/38 438/23 |
| 2021/0066066 | A1* | 3/2021 | Lee | H10D 1/716 |
| 2022/0052137 | A1* | 2/2022 | Song | H10K 59/873 |
| 2022/0216273 | A1* | 7/2022 | Kim | H10K 59/353 |
| 2022/0415962 | A1* | 12/2022 | Lee | H10H 29/142 |
| 2024/0121989 | A1* | 4/2024 | Jung | H10K 59/38 |
| 2024/0138194 | A1* | 4/2024 | Park | H10K 59/1201 |

FOREIGN PATENT DOCUMENTS

| | | |
|---|---|---|
| CN | 113410412 A | 9/2021 |
| KR | 1020170050171 | 5/2017 |

* cited by examiner

*Primary Examiner* — Tracie Y Green
(74) *Attorney, Agent, or Firm* — CANTOR COLBURN LLP

(57) ABSTRACT

A display device includes: a first pixel electrode disposed in a first emission area on a substrate and formed as multiple layers, an insulating layer covering an edge of the first pixel electrode, a first light emitting layer disposed on the first pixel electrode and the insulating layer, a first common electrode disposed on the first light emitting layer, a bank disposed on the insulating layer and surrounding the first emission area, and a first thin-film pattern disposed on the insulating layer and the bank in an adjacent area to the first emission area. An uppermost layer of the first pixel electrode and the first thin-film pattern include the same material.

20 Claims, 15 Drawing Sheets

DISPLAY DEVICE HAVING IMPROVED HOLE INJECTION STRUCTURE VIA THE PIXEL ELECTRODE AND METHOD OF MANUFACTURING THE SAME

This application claims priority to Korean Patent Application No. 10-2022-0183390 filed on Dec. 23, 2022, and all the benefits accruing therefrom under 35 U.S.C. § 119, the content of which in its entirety is herein incorporated by reference.

BACKGROUND

1. Technical Field

The present disclosure relates to a display device and a method of manufacturing the same.

2. Description of the Related Art

As the information society develops, the demand for a display device for displaying images has increased and diversified. For example, the display device has been applied to various electronic devices such as smartphones, digital cameras, laptop computers, navigation devices, and smart televisions. The display device may be a flat panel display device such as a liquid crystal display device, a field emission display device, or an organic light emitting display device. Among such a flat panel display device, a light emitting display device may display an image without a backlight unit providing light to a display panel because each of pixels of the display panel includes light emitting elements that may emit light by themselves.

SUMMARY

Aspects of the present disclosure provide a display device capable of improving display quality by stably maintaining hole injection characteristics of pixel electrodes and improving light emission characteristics of light emitting elements and a method of manufacturing the same.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment, a display device includes: a first pixel electrode disposed in a first emission area on a substrate and formed as multiple layers, an insulating layer covering an edge of the first pixel electrode, a first light emitting layer disposed on the first pixel electrode and the insulating layer, a first common electrode disposed on the first light emitting layer, a bank disposed on the insulating layer and surrounding the first emission area, and a first thin-film pattern disposed on the insulating layer and the bank in an adjacent area to the first emission area. An uppermost layer of the first pixel electrode and the first thin-film pattern include the same material.

The first pixel electrode may include a first layer disposed in the first emission area of the substrate, a second layer disposed on the first layer, a third layer disposed on the second layer, and a fourth layer disposed on the third layer to be the uppermost layer of the first pixel electrode.

The first layer of the first pixel electrode may include indium tin oxide ("ITO"), indium zinc oxide ("IZO"), or indium tin zinc oxide ("ITZO"). The second layer of the first pixel electrode may include silver (Ag), copper (Cu), aluminum (Al), nickel (Ni), or lanthanum (La). The third layer of the first pixel electrode may include indium gallium zinc oxide ("IGZO"), indium zinc oxide (IZO), or zinc-doped indium tin oxide (Zn-ITO). The fourth layer of the first pixel electrode may include indium tin oxide (ITO).

The display device may further include residual patterns disposed between the insulating layer and an edge of the third layer of the first pixel electrode.

The residual pattern may include molybdenum Tantalum Oxide (MoTaOx).

A thickness of the residual pattern may be greater than the thickness of the fourth layer of the first pixel electrode.

The display device may further include a first organic pattern formed of or including the same material in the same process as the first light emitting layer, and disposed on the first thin-film pattern, and a first electrode pattern formed of or including the same material in the same process as the first common electrode, and disposed on the first organic pattern.

The bank may include a first bank disposed on the insulating layer and including a metal material, and a second bank disposed on the first bank. A side surface of the first bank may be recessed inward from a side surface of the second bank.

The display device may further include a second pixel electrode disposed in a second emission area on the substrate and formed as multiple layers, a second light emitting layer disposed on the second pixel electrode and the insulating layer, and a second common electrode disposed on the second light emitting layer.

The first and second common electrodes may be electrically connected to each other through the first bank.

According to an embodiment, a method of manufacturing a display device includes: forming first and second pixel electrodes each including multiple layers on a substrate, sequentially stacking a sacrificial layer, an insulating layer, and a bank on the first and second pixel electrodes, forming a first photoresist not overlapping the first pixel electrode on the bank in a plan view; etching the bank and the insulating layer using the first photoresist as a mask, removing at least part of the sacrificial layer, additionally forming an uppermost layer of the first pixel electrode on the first pixel electrode and forming a first thin-film pattern on the insulating layer and the bank, and forming a first light emitting layer on the uppermost layer of the first pixel electrode and forming a first organic pattern on the first thin-film pattern.

The removing of the part of the sacrificial layer may include removing the at least part of the sacrificial layer through a cleaning process using water or tetra methyl ammonium hydroxide ("TMAH").

The sacrificial layer may include molybdenum Tantalum Oxide (MoTaOx).

The forming of the first pixel electrode including the multiple layers on the substrate may include: forming a first layer on a first emission area of the substrate, forming a second layer on the first layer, and forming a third layer on the second layer. The forming of the uppermost layer of the first pixel electrode may include forming a fourth layer, which is the uppermost layer of the first pixel electrode, on the third layer.

The first layer of the first pixel electrode may include indium tin oxide (ITO), indium zinc oxide (IZO), or indium tin zinc oxide (ITZO). The second layer of the first pixel electrode may include silver (Ag), copper (Cu), aluminum (Al), nickel (Ni), or lanthanum (La). The third layer of the first pixel electrode may include indium gallium zinc oxide (IGZO), indium zinc oxide (IZO), or zinc-doped indium tin oxide (Zn-ITO). The fourth layer of the first pixel electrode may include indium tin oxide (ITO).

The etching of the bank and the insulating layer may include forming a tip protruding from an inner sidewall of the bank and a tip protruding from an inner sidewall of the insulating laver.

The forming of the uppermost layer of the first pixel electrode and the first thin-film pattern may include cutting a metal material deposited on the substrate by the tip of the insulating layer and the tip of the bank to separate the metal material into the uppermost layer of the first pixel electrode and the first thin-film pattern.

The forming of the first light emitting layer and the first organic pattern may include cutting an organic material deposited on the substrate by the tip of the bank to separate the organic material into the first light emitting layer and the first organic pattern.

The method of manufacturing a display device may further include, after forming the first light emitting layer and the first organic pattern, forming a first common electrode on the first light emitting layer and forming a first electrode pattern on the first organic pattern, forming a capping layer on the first common electrode and forming a first capping pattern on the first electrode pattern, and forming a first inorganic layer covering side surfaces of the bank, the capping layer, and the first capping pattern.

The forming of the first common electrode and the first electrode pattern may include cutting a metal material deposited on the substrate by the tip of the bank to separate the metal material into the first common electrode and the first electrode pattern.

With a display device and a method of manufacturing the same according to embodiments, by forming an uppermost layer of the pixel electrode that is not contaminated or damaged immediately before the light emitting layer is deposited, the display device may effectively improve display quality by stably maintaining hole injection characteristics of pixel electrodes and improving light emission characteristics of light emitting elements.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
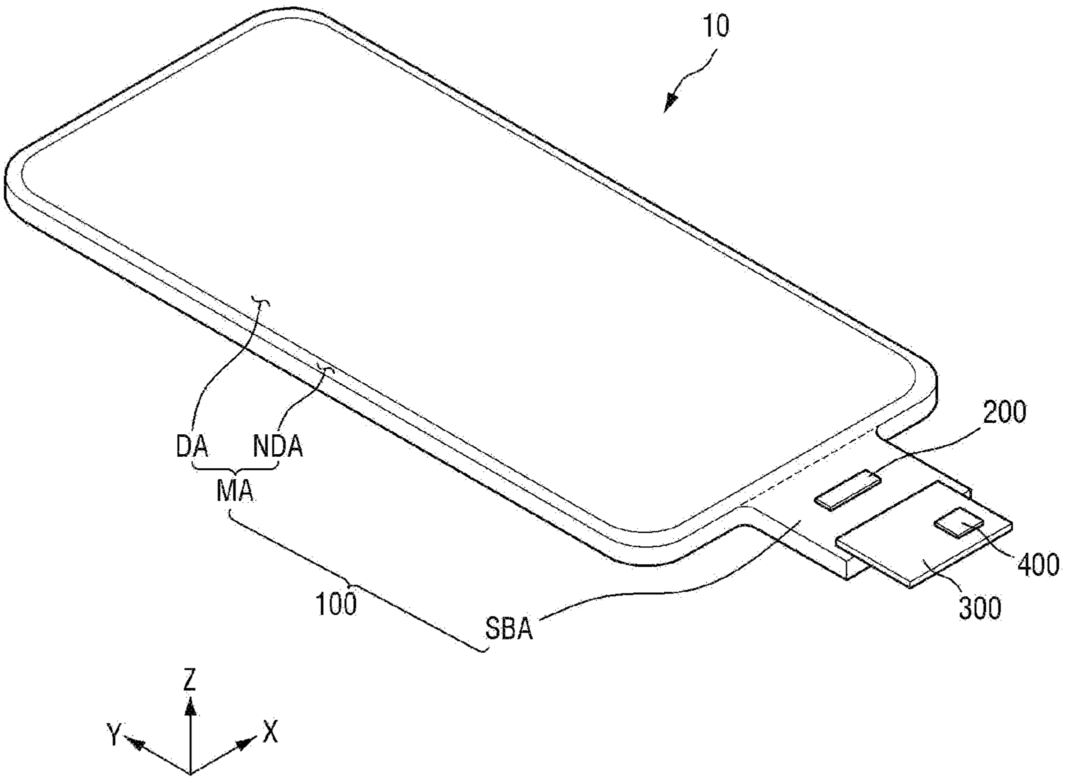
FIG. 1 is a perspective view illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below;" "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below: Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a" "an," and "the" are intended to include the plural forms as well, unless the context clearly indicates otherwise. Moreover, the terms "comprises," "comprising." "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the disclosure is described with reference to the accompanying drawings.

FIG. 1 is a perspective view illustrating a display device according to an embodiment.

Referring to FIG. 1, a display device 10 may be applied to portable electronic devices such as mobile phones, smartphones, tablet personal computers ("PCs"), mobile communication terminals, electronic notebooks, electronic books, portable multimedia players ("PMPs"), navigation devices, and ultra mobile PCs ("UMPCs"). As an example, the display device 10 may be applied as a display unit of televisions, laptop computers, monitors, billboards, or the Internet of Things ("IOTs"). As another example, the display device 10 may be applied to wearable devices such as smart watches, watch phones, glasses-type displays, and head mounted displays ("HMDs").

The display device 10 may have a shape similar to a rectangular shape in plan view. As used herein, the "plan view" is a view in a thickness direction (Z-axis direction). In an embodiment, for example, the display device 10 may have a shape similar to a rectangular shape, in plan view; having short sides in an X-axis direction and long sides in a Y-axis direction. A corner where the short side in the X-axis direction and the long side in the Y-axis direction meet may be rounded with a predetermined curvature or may be right-angled. The shape of the display device 10 in plan view is not limited to the rectangular shape, and may be a shape similar to other polygonal shapes, a circular shape, or an elliptical shape.

The display device 10 may include a display panel 100, a display driver 200, a circuit board 300, and a touch driver 400.

The display panel 100 may include a main area MA and a sub-area SBA.

The main area MA may include a display area DA including pixels displaying an image and a non-display area NDA disposed around the display area DA. The display area DA may emit light from a plurality of emission areas or a plurality of opening areas. In an embodiment, for example, the display panel 100 may include pixel circuits including switching elements, a pixel defining film defining the emission areas or the opening areas, and self-light emitting elements.

In an embodiment, for example, the self-light emitting element may include at least one of an organic light emitting diode ("LED") including an organic light emitting layer, a quantum dot LED including a quantum dot light emitting layer, an inorganic LED including an inorganic semiconductor, and a micro LED, but is not limited thereto.

The non-display area NDA may be an area outside the display area DA. The non-display area NDA may be defined as an edge area of the main area MA of the display panel 100. The non-display area NDA may include a gate driver (not illustrated) supplying gate signals to gate lines, and fan-out lines (not illustrated) connecting the display driver 200 and the display area DA to each other.

The sub-area SBA may extend from one side of the main area MA. The sub-area SBA may include a flexible material that may be bent, folded, and rolled. In an embodiment, for example, when the sub-area SBA is bent, the sub-area SBA may overlap the main area MA in a thickness direction (Z-axis direction). The sub-area SBA may include the display driver 200 and pad parts connected to the circuit board 300. Alternatively, the sub-area SBA may be omitted, and the display driver 200 and the pad parts may be disposed in the non-display area NDA.

The display driver 200 may output signals and voltages for driving the display panel 100. The display driver 200 may supply data voltages to data lines. The display driver 200 may supply source voltages to power lines and supply gate control signals to the gate driver. The display driver 200 may be formed as an integrated circuit ("IC") and be mounted on the display panel 100 in a chip on glass ("COG") manner, a chip on plastic ("COP") manner, or an ultrasonic bonding manner. As an example, the display driver 200 may be disposed in the sub-area SBA, and may overlap the main area MA in the thickness direction (Z-axis direction) by bending of the sub-area SBA. As another example, the display driver 200 may be mounted on the circuit board 300.

The circuit board 300 may be attached onto the pad parts of the display panel 100 using an anisotropic conductive film ("ACF"). Lead lines of the circuit board 300 may be electrically connected to the pad parts of the display panel 100. The circuit board 300 may be a flexible printed circuit board, a printed circuit board, or a flexible film such as a chip on film.

The touch driver 400 may be mounted on the circuit board 300. The touch driver 400 may be electrically connected to a touch sensing unit of the display panel 100. The touch driver 400 may supply touch driving signals to a plurality of touch electrodes of the touch sensing unit and sense change amounts in capacitance between the plurality of touch electrodes. In an embodiment, for example, the touch driving signal may be a pulse signal having a predetermined frequency. The touch driver 400 may decide whether or not an input has occurred and calculate input coordinates, based on the change amounts in capacitance between the plurality of touch electrodes. The touch driver 400 may be formed as an integrated circuit (IC).

Figure 2:
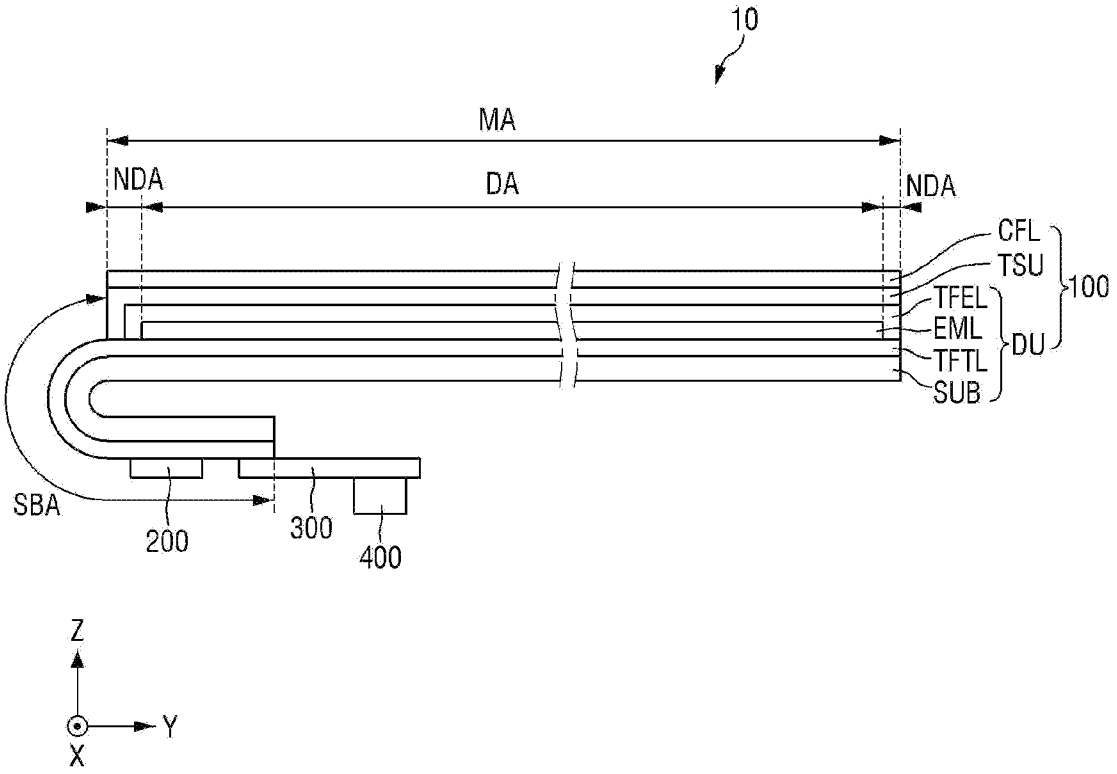
FIG. 2 is a cross-sectional view illustrating the display device according to an embodiment.

FIG. 2 is a cross-sectional view illustrating the display device according to an embodiment.

Referring to FIG. 2, the display panel 100 may include a display unit DU, a touch sensing unit TSU, and a color filter layer CFL. The display unit DU may include a substrate SUB, a thin-film transistor layer TFTL, a light emitting element layer EML, and an encapsulation layer TFEL.

The substrate SUB may be a base substrate or a base member. The substrate SUB may be a flexible substrate that may be bent, folded, and rolled. As an example, the substrate SUB may include a polymer resin such as polyimide ("PI"), but is not limited thereto. As another example, the substrate SUB may include a glass material or a metal material.

The thin-film transistor layer TFTL may be disposed on the substrate SUB. The thin-film transistor layer TFTL may include a plurality of thin-film transistors constituting pixel circuits of pixels. The thin-film transistor layer TFTL may further include gate lines, data lines, power lines, gate control lines, fan-out lines connecting the display driver 200 and the data lines to each other, and lead lines connecting the display driver 200 and the pad parts to each other. Each of the thin-film transistors may include a semiconductor region, a source electrode, a drain electrode, and a gate electrode. In an embodiment, for example, when the gate driver is disposed on one side of the non-display area NDA of the display panel 100, the gate driver may include thin-film transistors.

The thin-film transistor layer TFTL may be disposed in the display area DA, the non-display area NDA, and the sub-area SBA. The thin-film transistors of each of the pixels, the gate lines, the data lines, and the power lines of the thin-film transistor layer TFTL may be disposed in the display area DA. The gate control lines and the fan-out lines of the thin-film transistor layer TFTL may be disposed in the non-display area NDA. The lead lines of the thin-film transistor layer TFTL may be disposed in the sub-area SBA.

The light emitting element layer EML may be disposed on the thin-film transistor layer TFTL. The light emitting element layer EML may include a plurality of light emitting elements in which a pixel electrode, a light emitting layer, and a common electrode are sequentially stacked to emit light and a pixel defining film defining pixels. The plurality of light emitting elements of the light emitting element layer EML may be disposed in the display area DA.

In an embodiment, for example, the light emitting layer may be an organic light emitting layer including an organic material. The light emitting layer may include a hole transporting layer, an organic light emitting layer, and an electron transporting layer. When the pixel electrode receives a predetermined voltage through the thin-film transistor of the thin-film transistor layer TFTL and the common electrode receives a cathode voltage, holes and electrons may move to the organic light emitting layer through the hole transporting layer and the electron transporting layer, respectively, and may be combined with each other in the organic light emitting layer to emit light. In an embodiment, for example, the pixel electrode may be an anode electrode and the common electrode may be a cathode electrode, but the present disclosure is not limited thereto.

As another example, the plurality of light emitting elements may include quantum dot light emitting diodes including a quantum dot light emitting layer, inorganic light emitting diodes including an inorganic semiconductor, or micro light emitting diodes.

The encapsulation layer TFEL may cover an upper surface and side surfaces of the light emitting element layer EML, and may protect the light emitting element layer EML. The encapsulation layer TFEL may include at least one inorganic film and at least one organic film for encapsulating the light emitting element layer EML.

The touch sensing unit TSU may be disposed on the encapsulation layer TFEL. The touch sensing unit TSU may include a plurality of touch electrodes for sensing a user's touch in a capacitance manner and touch lines connecting the plurality of touch electrodes and the touch driver 400 to each other. As an example, the touch sensing unit TSU may sense the user's touch in a mutual capacitance manner or a self-capacitance manner.

As another example, the touch sensing unit TSU may be disposed on a separate substrate disposed on the display unit DU. In this case, the substrate supporting the touch sensing unit TSU may be a base member encapsulating the display unit DU.

The plurality of touch electrodes of the touch sensing unit TSU may be disposed in a touch sensor area overlapping the display area DA in a plan view: The touch lines of the touch sensing unit TSU may be disposed in a touch peripheral area overlapping the non-display area NDA in a plan view:

The color filter layer CFL may be disposed on the touch sensing unit TSU. The color filter layer CFL may include a plurality of color filters each corresponding to the plurality of emission areas. Each of the color filters may selectively transmit light of a specific wavelength therethrough and block or absorb light of other wavelengths. The color filter layer CFL may absorb some of light introduced from the outside of the display device 10 to reduce reflected light by external light. Accordingly, the color filter layer CFL may prevent distortion of colors due to external light reflection.

Since the color filter layer CFL is directly disposed on the touch sensing unit TSU, the display device 10 may not require a separate substrate for the color filter layer CFL. Accordingly, a thickness of the display device 10 may be relatively decreased.

The sub-area SBA of the display panel 100 may extend from one side of the main area MA. The sub-area SBA may include a flexible material that may be bent, folded, and rolled. In an embodiment, for example, when the sub-area SBA is bent, the sub-area SBA may overlap the main area MA in the thickness direction (Z-axis direction). The sub-area SBA may include the display driver 200 and the pad parts connected to a circuit board 300.

Figure 3:
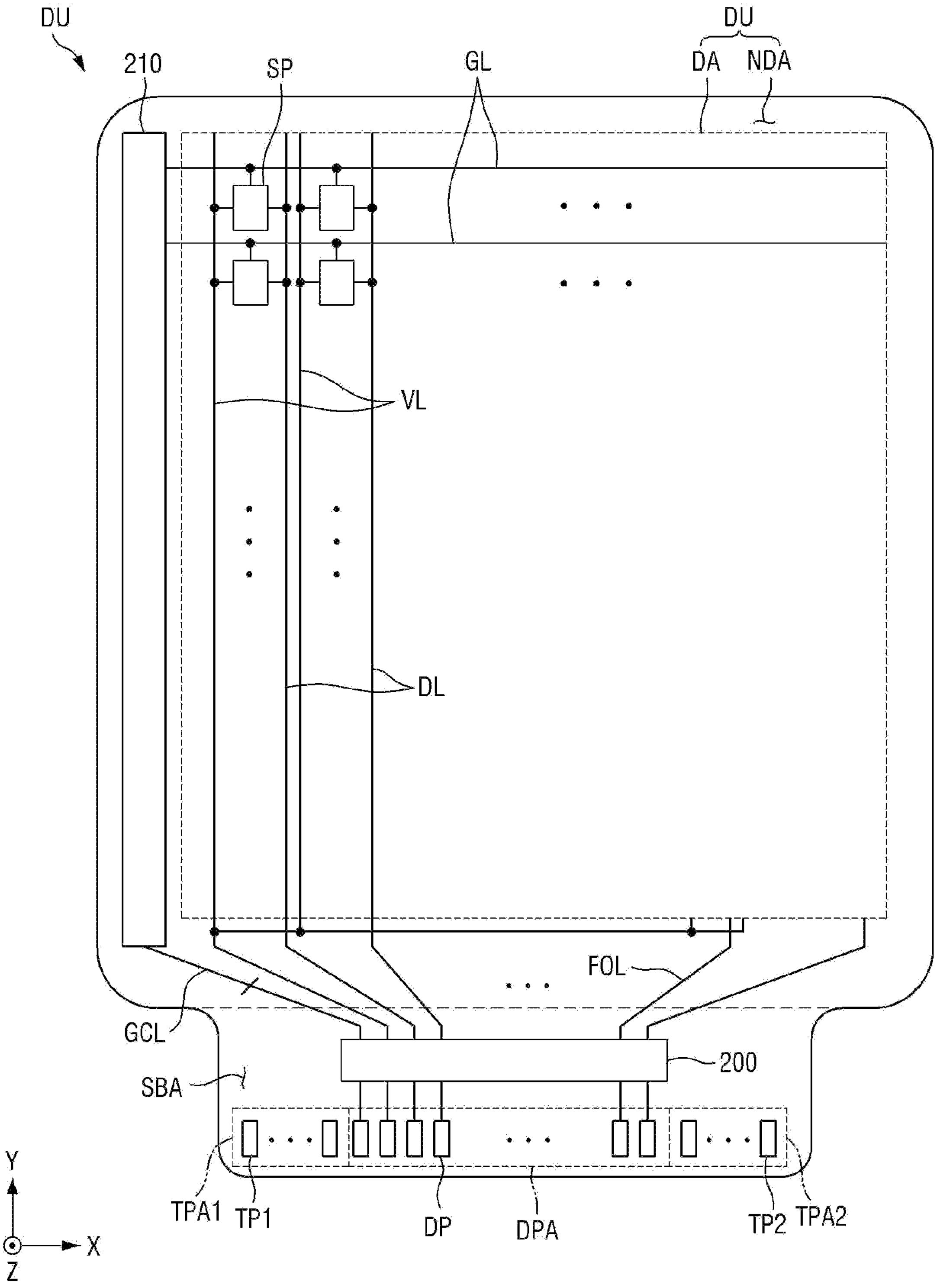
FIG. 3 is a plan view illustrating a display unit of the display device according to an embodiment.

FIG. 3 is a plan view illustrating a display unit of the display device according to an embodiment.

Referring to FIG. 3, the display unit DU may include a display area DA and a non-display area NDA.

The display area DA is an area displaying an image, and may be defined as a central area of the display panel 100. The display area DA may include a plurality of pixels SP, a plurality of gate lines GL, a plurality of data lines DL, and a plurality of power lines VL. Each of the plurality of pixels SP may be defined as a minimum unit outputting light.

The plurality of gate lines GL may supply gate signals received from a gate driver 210 to the plurality of pixels SP. The plurality of gate lines GL may extend in the X-axis direction, and may be spaced apart from each other in the Y-axis direction crossing the X-axis direction.

The plurality of data lines DL may supply data voltages received from the display driver 200 to the plurality of pixels SP. The plurality of data lines DL may extend in the Y-axis direction, and may be spaced apart from each other in the X-axis direction.

The plurality of power lines VL may supply source voltages received from the display driver 200 to the plurality of pixels SP. Here, the source voltage may be at least one of a driving voltage, an initialization voltage, a reference voltage, and a low potential voltage. The plurality of power lines VL may extend in the Y-axis direction, and may be spaced apart from each other in the X-axis direction.

The non-display area NDA may surround the display area DA. The non-display area NDA may include the gate driver 210, fan-out lines FOL, and gate control lines GCL. The gate driver 210 may generate a plurality of gate signals based on gate control signals, and may sequentially supply the plurality of gate signals to the plurality of gate lines GL according to a set order.

The fan-out lines FOL may extend from the display driver 200 to the display area DA. The fan-out lines FOL may supply the data voltages received from the display driver 200 to the plurality of data lines DL.

The gate control lines GCL may extend from the display driver 200 to the gate driver 210. The gate control lines GCL may supply the gate control signals received from the display driver 200 to the gate driver 210.

The sub-area SBA may include the display driver 200, a display pad area DPA, and first and second touch pad areas TPA1 and TPA2.

The display driver 200 may output signals and voltages for driving the display panel 100 to the fan-out lines FOL. The display driver 200 may supply the data voltages to the data lines DL through the fan-out lines FOL. The data voltages may be supplied to the plurality of pixels SP, and may determine luminance of the plurality of pixels SP. The display driver 200 may supply the gate control signals to the gate driver 210 through the gate control lines GCL.

The display pad area DPA, the first touch pad area TPA1, and the second touch pad area TPA2 may be disposed at an edge of the sub-area SBA. The display pad area PA, the first touch pad area TPA1, and the second touch pad area TPA2 may be electrically connected to the circuit board 300 using a low-resistance and high-reliability material such as an anisotropic conductive film or a self assembly anisotropic conductive paste ("SAP").

The display pad area DPA may include a plurality of display pad parts DP. The plurality of display pad parts DP may be electrically connected to a graphic system through the circuit board 300. The plurality of display pad parts DP may be connected to the circuit board 300 to receive digital video data, and may supply the digital video data to the display driver 200.

The first touch pad area TPA1 may be disposed on one side of the display pad area DPA, and may include a plurality of first touch pad parts TP1. The plurality of first touch pad parts TP1 may be electrically connected to the touch driver 400 disposed on the circuit board 300. The plurality of first touch pad parts TP1 may supply touch driving signals to a plurality of driving electrodes through a plurality of driving lines.

The second touch pad area TPA2 may be disposed on the other side of the display pad area DPA, and may include a plurality of second touch pad parts TP2. The plurality of second touch pad parts TP2 may be electrically connected to the touch driver 400 disposed on the circuit board 300. The touch driver 400 may receive touch sensing signals through a plurality of sensing lines connected to the plurality of second touch pad parts TP2, and may sense a change in mutual capacitance between the driving electrodes and the sensing electrodes.

Figure 4:
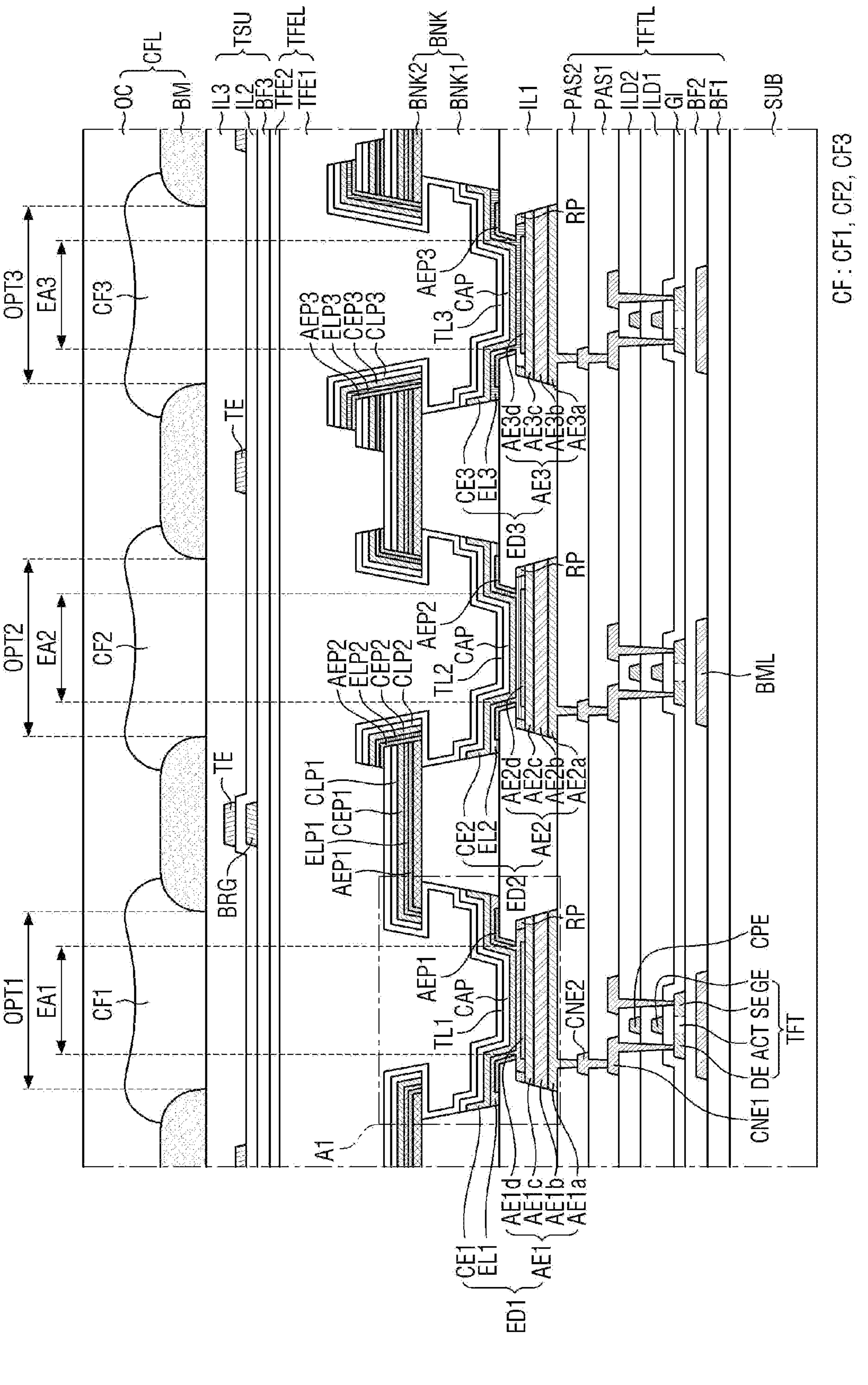
FIG. 4 is a cross-sectional view illustrating a portion of the display device according to another embodiment.
Figure 5:
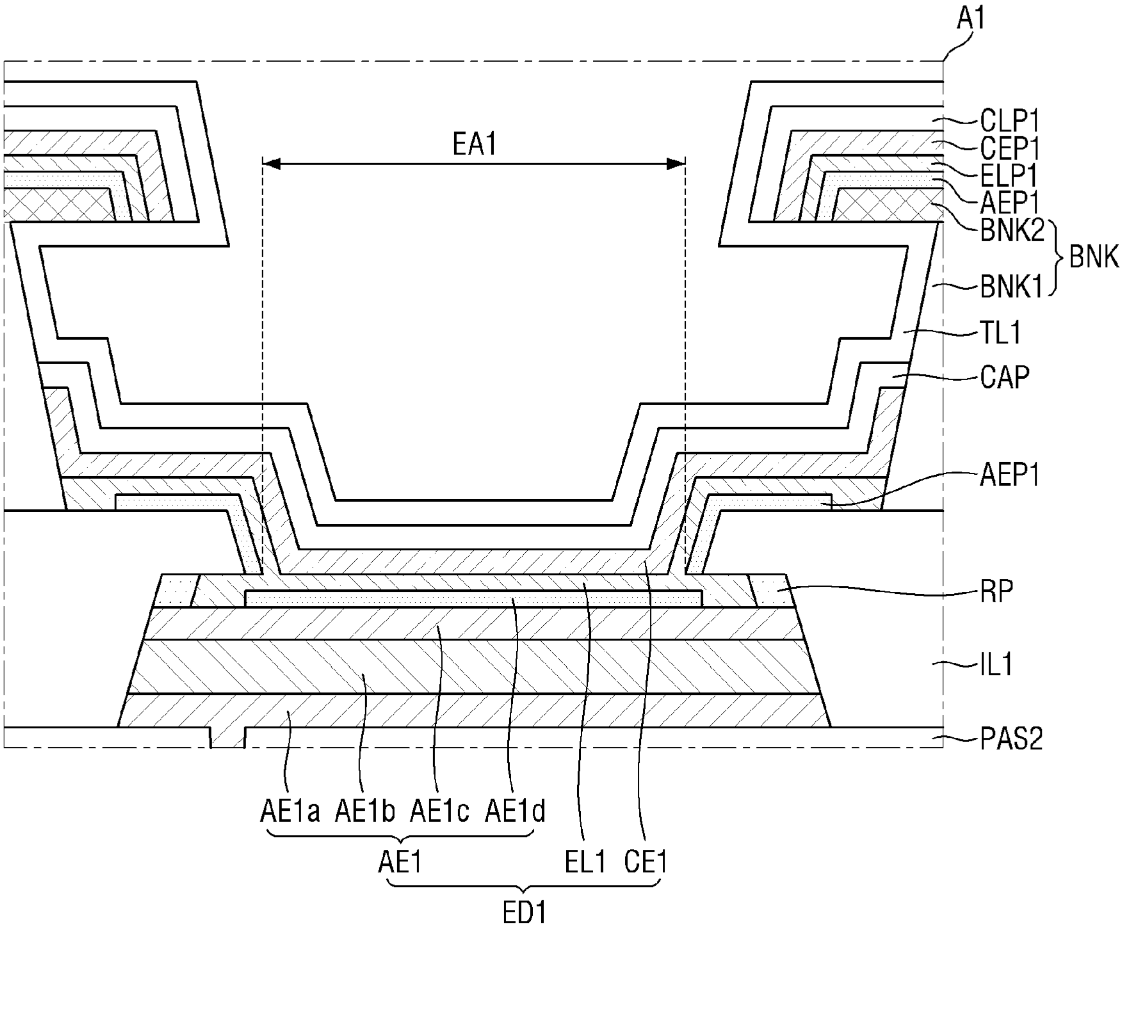
FIG. 5 is an enlarged view of area A1 of FIG. 4.

FIG. 4 is a cross-sectional view illustrating a portion of the display device according to another embodiment, and FIG. 5 is an enlarged view of area A1 of FIG. 4.

Referring to FIGS. 4 and 5, the display panel 100 may include a display unit DU, a touch sensing unit TSU, and a color filter layer CFL. The display unit DU may include a substrate SUB, a thin-film transistor layer TFTL, a light emitting element layer EML, and an encapsulation layer TFEL.

The substrate SUB may be a base substrate or a base member. The substrate SUB may be a flexible substrate that may be bent, folded, and rolled. As an example, the substrate SUB may include a polymer resin such as polyimide (PI), but is not limited thereto. As another example, the substrate SUB may include a glass material or a metal material.

The thin-film transistor layer TFTL may include a first buffer layer BF1, a light blocking layer BML, a second buffer layer BF2, thin-film transistors TFT, a gate insulating layer GI, a first interlayer-insulating layer ILD1, capacitor electrodes CPE, a second interlayer-insulating layer ILD2, first connection electrodes CNE1, a first passivation layer PAS1, second connection electrodes CNE2, and a second passivation layer PAS2.

The first buffer layer BF1 may be disposed on the substrate SUB. The first buffer layer BF1 may include an inorganic film capable of preventing permeation of air or moisture. In an embodiment, for example, the first buffer layer BF1 may include a plurality of inorganic films that are alternately stacked.

The light blocking layer BML may be disposed on the first buffer layer BF1. As an example, the light blocking layer BML may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. As another example, the light blocking layer BML may be an organic film including a black pigment.

The second buffer layer BF2 may be disposed on the first buffer layer BF1 and the light blocking layer BML. The second buffer layer BF2 may include an inorganic film capable of preventing permeation of air or moisture. In an embodiment, for example, the second buffer layer BF2 may include a plurality of inorganic films that are alternately stacked.

The thin-film transistor TFT may be disposed on the second buffer layer BF2, and may constitute a pixel circuit of each of the plurality of pixels. In an embodiment, for example, the thin-film transistor TFT may be a driving transistor or a switching transistor of the pixel circuit. The thin-film transistor TFT may include a semiconductor region ACT, a source electrode SE, a drain electrode DE, and a gate electrode GE.

The semiconductor region ACT, the source electrode SE, and the drain electrode DE may be disposed on the second buffer layer BF2. The semiconductor region ACT, the source electrode SE, and the drain electrode DE may overlap the light blocking layer BML in the thickness direction. The semiconductor region ACT may overlap the gate electrode GE in the thickness direction, and may be insulated from the gate electrode GE by the gate insulating layer GI. The source electrode SE and the drain electrode DE may be provided by making a material of the semiconductor region ACT conductors.

The gate electrode GE may be disposed on the gate insulating layer GI. The gate electrode GE may overlap the semiconductor region ACT in a plan view with the gate insulating layer GI interposed therebetween.

The gate insulating layer GI may be disposed on the semiconductor region ACT, the source electrode SE, and the drain electrode DE. In an embodiment, for example, the gate insulating layer GI may cover the semiconductor region ACT, the source electrode SE, the drain electrode DE, and the second buffer layer BF2, and may insulate the semiconductor region ACT and the gate electrode GE from each other.

The first interlayer-insulating layer ILD1 may be disposed on the gate electrode GE and the gate insulating layer GI. The first interlayer-insulating layer ILD1 may insulate the gate electrode GE and the capacitor electrode CPE from each other.

The capacitor electrode CPE may be disposed on the first interlayer-insulating layer ILD1. The capacitor electrode CPE may overlap the gate electrode GE in the thickness direction. The capacitor electrode CPE and the gate electrode GE may form a capacitance.

The second interlayer-insulating layer ILD2 may be disposed on the capacitor electrode CPE and the first interlayer-insulating layer ILD1. The second interlayer-insulating layer ILD2 may insulate the capacitor electrode CPE and the first connection electrode CNE1 from each other.

The first connection electrode CNE1 may be disposed on the second interlayer-insulating layer ILD2. The first connection electrode CNE1 may electrically connect the drain electrode DE of the thin-film transistor TFT and the second connection electrode CNE2 to each other. The first connection electrode CNE1 may be inserted into contact holes provided in the second interlayer-insulating layer ILD2, the first interlayer-insulating layer ILD1, and the gate insulating layer GI to be in contact with the drain electrode DE of the thin-film transistor TFT.

The first passivation layer PAS1 may be disposed on the first connection electrode CNE1 and the second interlayer-insulating layer ILD2. The first passivation layer PAS1 may protect the thin-film transistor TFT. The first passivation layer PAS1 may insulate the first connection electrode CNE1 and the second connection electrode CNE2 from each other.

The second connection electrode CNE2 may be disposed on the first passivation layer PAS1. The second connection electrode CNE2 may electrically connect the first connection electrode CNE1 and a first pixel electrode AE1 of a first light emitting element ED1 to each other. The second connection electrode CNE2 may be inserted into a contact hole provided in the first passivation layer PAS1 to be in contact with the first connection electrode CNE1. The second passivation layer PAS2 may be disposed on the second connection electrode CNE2 and the first passivation layer PAS1. The second passivation layer PAS2 may insulate the second connection electrode CNE2 and the first pixel electrode AE1 from each other.

The light emitting element layer EML may be disposed on the thin-film transistor layer TFTL. The light emitting element layer EML may include first to third light emitting elements ED1, ED2, and ED3, residual patterns RP, a first insulating layer IL1, capping layers CAP, a bank BNK, first to third thin-film patterns AEP1, AEP2, and AEP3, first to third organic patterns ELP1, ELP2, and ELP3, first to third electrode patterns CEP1, CEP2, and CEP3, first to third capping patterns CLP1, CLP2, and CLP3, and first to third inorganic layers TL1, TL2, and TL3.

The display device 10 may include a plurality of pixels arranged along a plurality of rows and columns in the display area DA. Each of the plurality of pixels may include first to third emission areas EA1, EA2, and EA3 defined by the bank BNK or the pixel defining film, and may emit light having a predetermined peak wavelength through the first to third emission areas EA1, EA2, and EA3. Each of the first to third emission areas EA1, EA2, and EA3 may be an area in which light generated by a light emitting element of the display device 10 is emitted to the outside of the display device 10.

The first to third emission areas EA1, EA2, and EA3 may emit light having a predetermined peak wavelength to the outside of the display device 10. The first emission area EA1 may emit light of a first color, the second emission area EA2 may emit light of a second color, and the third emission area EA3 may emit light of a third color. In an embodiment, for example, the light of the first color may be red light having a peak wavelength in the range of about 610 nanometers (nm) to 650 nm, the light of the second color may be green light having a peak wavelength in the range of about 510 nm to 550 nm, and the light of the third color may be blue light having a peak wavelength in the range of about 440 nm to 480 nm, but the present disclosure is not limited thereto.

As an example, an area of the third emission area EA3 may be greater than an area of the first emission area EA1, and an area of the first emission area EA1 may be greater than an area of the second emission area EA2, but the present disclosure is not limited thereto. As another example, an area of the first emission area EA1, an area of the second emission area EA2, and an area of the third emission area EA3 may be substantially the same as each other.

The first light emitting element ED1 may be disposed in the first emission area EA1 on the thin-film transistor layer TFTL. The first light emitting element ED1 may include the first pixel electrode AE1, a first light emitting layer EL1, and a first common electrode CE1. The second light emitting element ED2 may be disposed in the second emission area EA2 on the thin-film transistor layer TFTL. The second light emitting element ED2 may include a second pixel electrode AE2, a second light emitting layer EL2, and a second common electrode CE2. The third light emitting element ED3 may be disposed in the third emission area EA3 on the thin-film transistor layer TFTL. The third light emitting element ED3 may include a third pixel electrode AE3, a third light emitting layer EL3, and a third common electrode CE3.

The first to third pixel electrodes AE1, AE2, and AE3 may be disposed on the second passivation layer PAS2. Each of the first to third pixel electrodes AE1, AE2, and AE3 may be electrically connected to the drain electrode DE of the thin-film transistor TFT through the first and second connection electrodes CNE1 and CNE2. The first to third pixel electrodes AE1, AE2, and AE3 may be insulated from each other by the first insulating layer IL1.

The first pixel electrode AE1 may be formed of or include multiple layers including different materials. The first pixel electrode AE1 may include first to fourth layers AE1*a*, AE1*b*, AE1*c*, and AE1*d*. The first layer AE1*a* of the first pixel electrode AE1 may be disposed on the second passivation layer PAS2. The first layer AE1*a* of the first pixel electrode AE1 may include a material having high adhesion to the second passivation layer PAS2 and a material having high electrical conductivity. In an embodiment, for example, the first layer AE1*a* of the first pixel electrode AE1 may include indium tin oxide (ITO), indium zinc oxide (IZO), or indium tin zinc oxide (ITZO), but is not limited thereto.

The second layer AE1*b* of the first pixel electrode AE1 may be disposed on the first layer AE1*a*. The second layer AE1*b* of the first pixel electrode AE1 may include a material having high reflectivity. In an embodiment, for example, the second layer AE1*b* of the first pixel electrode AE1 may include silver (Ag), copper (Cu), aluminum (Al), nickel (Ni), or lanthanum (La), but is not limited thereto. The thickness of the second layer AE1*b* of the first pixel electrode AE1 may be greater than the thickness of the first layer AE1*a* or the thickness of the third layer AE1*c*.

The third layer AE1*c* of the first pixel electrode AE1 may be disposed on the second layer AE1*b*. Etching of the third layer AE1*c* of the first pixel electrode AE1 may be stopped in a dry etching process. The third layer AE1*c* of the first pixel electrode AE1 may protect the second layer AE1*b* during the manufacturing process of the display device 10. The third layer AE1*c* of the first pixel electrode AE1 may include an amorphous structure and can be easily and collectively etched together with the second layer AE1*b*. In an embodiment, for example, the third layer AE1*c* of the first pixel electrode AE1 may include indium gallium zinc oxide (IGZO), indium zinc oxide (IZO), or zinc-doped indium tin oxide (Zn-ITO), but the present disclosure is not limited thereto. Optionally, the third layer AE1*c* of the first pixel electrode AE1 may be omitted. The thickness of the third layer AE1*c* of the first pixel electrode AE1 may range from approximately 200 to 300 angstroms (Å), but is not limited thereto.

The fourth layer AE1*d* of the first pixel electrode AE1 may be disposed on the third layer AE1*c*. The fourth layer AE1*d* of the first pixel electrode AE1 may be formed immediately before the first light emitting layer EL1 is deposited, so that the fourth layer AE1*d* may not be contaminated or damaged during the deposition and etching processes performed before the fourth layer AE1 is formed. In an embodiment, for example, when the third layer AE1*c* of the first pixel electrode AE1 includes indium gallium zinc oxide (IGZO), indium zinc oxide (IZO), or zinc-doped indium tin oxide (Zn-ITO), the upper surface of the third layer AE1*c* of the first pixel electrode AE1 may be contaminated or damaged in the deposition and etching process performed before the fourth layer AE1 is formed, and therefore zinc (Zn) in the third layer AE1*c* may be diffused. When zinc (Zn) is diffused on the upper surface of the third layer AE1*c* of the first pixel electrode AE1 and directly contacts the first light emitting layer EL1, light emission characteristics of the first light emitting element ED1 may be deteriorated. Here, the deterioration of light emission characteristics means that the current density flowing through the first pixel electrode AE1 is reduced compared to the voltage applied to the first pixel electrode AE1, and thus the luminous efficiency of the first light emitting element ED1 is reduced. However, in an embodiment according to the invention, the fourth layer AE1*d* of the first pixel electrode AE1 may be disposed on the third layer AE1*c* before the first light emitting layer EL1 is deposited, thereby stably improving hole injection characteristics of the first pixel electrode AE1 and improving light emission characteristics. Therefore, the display device 10 may effectively improve display quality by including the fourth layer AE1*d*, which is the uppermost layer of the first pixel electrode AE1, without being contaminated or damaged during the manufacturing process of the display device 10. In an embodiment, for example, the fourth layer AE1*d* of the first pixel electrode AE1 may include indium tin oxide (ITO), but is not limited thereto. In an embodiment, the fourth layer AE1*d* may not include zinc (Zn).

The first thin-film pattern AEP1 may include the same metal material as the fourth layer AE1*d* of the first pixel electrode AE1 and may be disposed on the first insulating layer IL1 and the second bank BNK2. In an embodiment, the first thin-film pattern AEP1 and the fourth layer AE1*d* may be composed of the same material. The first thin-film pattern AEP1 may cover side surfaces of the first insulating layer IL1 and the side surfaces of the second bank BNK2 adjacent to the first emission area EA1. The fourth layer AE1*d* of the first pixel electrode AE1 and the first thin-film pattern AEP1 may be deposited in the same process and may be cut and separated from each other by the tip formed on the inner sidewall of the first insulating layer IL1 and the tip formed on the inner sidewall of the bank BNK. Accordingly, the first thin-film pattern AEP1 may be disposed on the first insulating layer IL1 in an area adjacent to the first emission area EA1, and may be disposed on the second bank BNK2 in an area other than the first to third emission areas EA1, EA2, and EA3.

Each of the second and third pixel electrodes AE2 and AE3 may be formed of or include multiple layers including different materials. The second pixel electrode AE2 may include first to fourth layers AE2*a*, AE2*b*, AE2*c*, and AE2*d*. The third pixel electrode AE3 may include first to fourth layers AE3*a*, AE3*b*, AE3*c*, and AE3*d*. The first layer AE2*a* of the second pixel electrode AE2 and the first layer AE3*a* of the third pixel electrode AE3 may be formed of or include the same material as the first layer AE1*a* of the first pixel electrode AE1 at the same layer as the first layer AE1*a* of the first pixel electrode AE1. The second layer AE2*b* of the second pixel electrode AE2 and the second layer AE3*b* of the third pixel electrode AE3 may be formed of or include the same material as the second layer AE1*b* of the first pixel electrode AE1 at the same layer as the second layer AE1*b* of the first pixel electrode AE1. The third layer AE2*c* of the second pixel electrode AE2 and the third layer AE3*c* of the third pixel electrode AE3 may be formed of or include the same material as the third layer AE1*c* of the first pixel electrode AE1 at the same layer as the third layer AE1*c* of the first pixel electrode AE1. The fourth layer AE2*d* of the second pixel electrode AE2 and the fourth layer AE3*d* of the third pixel electrode AE3 may be formed of or include the same material as the fourth layer AE1*d* of the first pixel electrode AE1 at the same layer as the fourth layer AE1*d* of the first pixel electrode AE1.

The first insulating layer IL1 may be disposed on the second passivation layer PAS2 and the residual patterns RP. The first insulating layer IL1 may cover edges of the third layers AE1*c*, AE2*c*, and AE3*c* of the first to third pixel electrodes AE1, AE2, and AE3 and the residual patterns RP, and may expose portions of fourth layers AE1*d*, AE2*d*, and AE3*d* of the first to third pixel electrodes AE1, AE2, and AE3. The residual pattern RP may have an undercut structure on the bottom portion of the first insulating layer IL1, and the inner wall of the first insulating layer IL1 may have a tip structure due to the residual pattern RP. The first insulating layer IL1 may expose the fourth layer AE1*d* of the first pixel electrode AE1, and the first light emitting layer EL1 may be disposed directly on the fourth layer AE1*d* of the first pixel electrode AE1. The first insulating layer IL1 may include an inorganic insulating material. The first insulating layer IL1 may include at least one of a silicon nitride layer, a silicon oxynitride layer, a silicon oxide layer, a titanium oxide layer, an aluminum oxide layer, and an amorphous silicon layer, but is not limited thereto.

The residual patterns RP may be disposed on edges of the third layers AE1*c*, AE2*c*, and AE3*c* of the first to third pixel electrodes AE1, AE2, and AE3. The residual patterns RP may be disposed between the first insulating layer IL1 and edges of light emitting layers EL1 to EL3. A side surface of the residual pattern RP may be recessed inward from a side surface of the first insulating layer IL1. The first insulating layer IL1 may not be in direct contact with the upper surface of each of the first to third pixel electrodes AE1, AE2, and AE3 by the residual pattern RP. The thickness of the residual pattern RP may be greater than a thickness of the fourth layer AE1*d* of the first pixel electrode AE1. The thickness of the residual pattern RP may be approximately 100 angstroms (Å) or less, and the thickness of the fourth layer AE1*d* of the first pixel electrode AE1 may be approximately 50 to 70 angstroms (Å), but are not limited thereto. The residual patterns RP may be formed by removing a sacrificial layer SFL (see FIG. 6) disposed on the first to third pixel electrodes AE1, AE2, and AE3 in processes of manufacturing the display device 10. In an embodiment, for example, the residual pattern RP may include molybdenum tantalum oxide (MoTaOx), but is not limited thereto. The residual pattern RP may include a material soluble in water or tetra methyl ammonium hydroxide (TMAH). The solubility of the residual pattern RP may be adjusted according to the composition ratio of tantalum, but is not limited thereto. Accordingly, the residual patterns RP may be formed without performing a separate wet etching process.

The first to third light emitting layers EL1, EL2, and EL3 may be organic light emitting layers made of an organic material, and may be disposed on the first to third pixel electrodes AE1, AE2, and AE3, respectively, through a deposition process. In an embodiment, for example, in a deposition process of the first to third light emitting layers EL1, EL2, and EL3, the organic material may be deposited in a direction inclined from an upper surface of the substrate SUB.

The first light emitting layer EL1 may be directly disposed on the first pixel electrode AE1 in the first emission area EA1. A portion of the first light emitting layer EL1 may be filled in a space surrounded by the first pixel electrode AE1, the residual pattern RP, and the first insulating layer IL1, and the other portion of the first light emitting layer EL1 may cover a first thin-film pattern AEP1 disposed on an upper surface and side surfaces of the first insulating layer IL1. The second light emitting layer EL2 may be disposed on the second pixel electrode AE2 in the second emission area EA2. A portion of the second light emitting layer EL2 may be filled in a space surrounded by the second pixel electrode AE2, the residual pattern RP, and the first insulating layer IL1, and the other portion of the second light emitting layer EL2 may cover a second thin-film pattern AEP2 disposed on an upper surface and side surfaces of the first insulating layer IL1. The third light emitting layer EL3 may be directly disposed on the third pixel electrode AE3 in the third emission area EA3. A portion of the third light emitting layer EL3 may be filled in a space surrounded by the third pixel electrode AE3, the residual pattern RP, and the first insulating layer IL1, and the other portion of the third light emitting layer EL3 may cover a third thin-film pattern AEP3 disposed on an upper surface and side surfaces of the first insulating layer IL1.

The first common electrode CE1 may be disposed on the first light emitting layer EL1, the second common electrode CE2 may be disposed on the second light emitting layer EL2, and the third common electrode CE3 may be disposed on the third light emitting layer EL3. The first to third common electrodes CE1, CE2, and CE3 may include a transparent conductive material, and may transmit light generated in the first to third light emitting layers EL1, EL2, and EL3 therethrough. The first to third common electrodes CE1, CE2, and CE3 may be in contact with side surfaces of a first bank BNK1, and may be electrically connected to each other by the first bank BNK1. In an embodiment, for example, the first to third common electrodes CE1, CE2, and CE3 may receive a common voltage or a low potential voltage.

The first pixel electrode AE1 may receive a voltage corresponding to a data voltage from the thin-film transistor TFT, and the first common electrode CE1 may receive a common voltage or a cathode voltage. In this case, a potential difference is formed between the first pixel electrode AE1 and the first common electrode CE1, such that holes and electrons may move to the first light emitting layer EL1 through a hole transporting layer and an electron transporting laver, respectively, and the first light emitting layer EL1 may emit light.

The capping layers CAP may be disposed on the first to third common electrodes CE1, CE2, and CE3. The capping layers CAP may include an inorganic insulating material, and may cover the first to third light emitting elements ED1, ED2, and ED3. The capping layers CAP may prevent the first to third light emitting elements ED1, ED2, and ED3 from being damaged by external air. In an embodiment, for example, the capping layer CAP may include at least one of a silicon nitride layer, a silicon oxynitride layer, a silicon oxide layer, a titanium oxide layer, an aluminum oxide layer, and an amorphous silicon layer, but is not limited thereto.

The bank BNK may be disposed on the first insulating layer IL1 and define first to third emission areas EA1, EA2, and EA3. The bank BNK may surround the first to third emission areas EA1, EA2, and EA3 in plan view: The bank BNK may overlap a light blocking member BM of the color filter layer CFL in a plan view. The bank BNK may include first to second banks BNK1 and BNK2.

The first bank BNK1 may be disposed on the first insulating layer IL1, and the second bank BNK2 may be disposed on the first bank BNK1. A side surface of the first bank BNK1 may be recessed inward from a side surface of the second bank BNK2. The side surface of the second bank BNK2 protrudes from the side surface of the first bank BNK1 toward the first emission area EA1, and thus, the second bank BNK2 may include a protruding tip. Accordingly, a lower portion of the tip of the second bank BNK2 may have an undercut structure. A thickness of the first bank BNK1 may be greater than a thickness of the second bank BNK2.

The first bank BNK1 and the second bank BNK2 may include metal materials different from each other. An etch rate of the first bank BNK1 may be different from an etch rate of the second bank BNK2. In an embodiment, for example, in a wet etching process, the etch rate of the first bank BNK1 may be higher than the etch rate of the second bank BNK2, and the first bank BNK1 may be etched more than the second bank BNK2 in a process of forming the first to third emission areas EA1, EA2, and EA3. Accordingly, shapes of the side surfaces of the first and second banks BNK1 and BNK2 may be determined by a difference between the etch rates of the first and second banks BNK1 and BNK2. The first bank BNK1 may include a metal material having high electrical conductivity and may electrically connect between the first to third common electrodes CE1, CE2, and CE3 spaced apart from each other. The second bank BNK2 may reduce reflection of external light by including a material having low reflectivity: In an embodiment, for example, the first bank BNK1 may include aluminum (Al), and the second bank BNK2 may include titanium (Ti), but are not limited thereto.

The bank BNK may form the first to third emission areas EA1, EA2, and EA3 through a mask process, and each of the first to third light emitting layers EL1, EL2, and EL3 may be disposed in each of the first to third emission areas EA1, EA2, and EA3. When the mask process is performed, a structure for mounting a mask may be desirable, and an excessively wide area of the non-display area NDA may be desirable in order to control distribution of the mask process. Accordingly, when the mask process is minimized, the structure for mounting the mask may be omitted, and the area of the non-display area NDA for controlling the distribution may be minimized.

The first to third light emitting elements ED1, ED2, and ED3 may be formed through deposition and etching processes rather than the mask process. Since the first bank BNK1 and the second bank BNK2 include the different metal material, an inner sidewall of the bank BNK may have a tip structure, and the display device 10 may include different layers individually disposed in the first to third emission areas EA1, EA2, and EA3 through a deposition process. In an embodiment, for example, the first light emitting layer EL1 and the first organic pattern ELP1 may be deposited using the same organic material in a deposition process that does not use a mask, and may be cut and separated from each other by a tip formed on the inner sidewall of the bank BNK. The first light emitting layer EL1 may be disposed in the first emission area EA1, and the first organic pattern ELP1 may be disposed on the first thin-film pattern AEP1 between the first to third emission areas EA1, EA2, and EA3.

An organic material for forming the first light emitting layer EL1 may be deposited on an entire surface of the display device 10, and the organic material of the first light emitting layer EL1 deposited in the second and third emission areas EA2 and EA3 may be removed. An organic material for forming the second light emitting layer EL2 may be deposited on the entire surface of the display device 10, and the organic material of the second light emitting layer EL2 deposited in the first and third emission areas EA1 and EA3 may be removed. An organic material for forming the third light emitting layer EL3 may be deposited on the entire surface of the display device 10, and the organic material of the third light emitting layer EL3 deposited in the first and second emission areas EA1 and EA2 may be removed. Accordingly, in the display device 10, different organic materials may be disposed in the first to third emission areas EA1, EA2, and EA3 through the deposition and etching processes without using the mask process. In the display device 10, unnecessary processes are omitted, such that a manufacturing cost may be reduced, and an area of the non-display area NDA may be minimized.

The first organic pattern ELP1 may include the same organic material as the first light emitting layer EL1 and may be disposed on the first thin-film pattern AEP1. The first organic pattern ELP1 may cover side surfaces of the first thin-film pattern AEP1 adjacent to the first emission area EA1. The first light emitting layer EL1 and the first organic pattern ELP1 may be deposited in the same process and may be cut and separated from each other by the tip formed on the inner sidewall of the bank BNK. Accordingly, the first organic pattern ELP1 may be disposed on the first thin-film pattern AEP1 in an area other than the first to third emission areas EA1, EA2, and EA3.

The first electrode pattern CEP1 may include the same metal material as the first common electrode CE1 and may be disposed on the first organic pattern ELP1. The first electrode pattern CEP1 may cover side surfaces of the first organic pattern ELP1 adjacent to the first emission area EA1. The first common electrode CE1 and the first electrode pattern CEP1 may be deposited in the same process, but may be cut by the tip formed on the inner sidewall of the bank BNK. Accordingly, the first electrode pattern CEP1 may be disposed on the first organic pattern ELP1 in the area other than the first to third emission areas EA1, EA2, and EA3.

The first capping pattern CLP1 may include the same inorganic material as the capping layer CAP and may be disposed on the first electrode pattern CEP1. The first capping pattern CLP1 may cover side surfaces of the first electrode pattern CEP1 adjacent to the first emission area EA1. The capping layer CAP and the first capping pattern CLP1 may be deposited in the same process, but may be cut by the tip formed on the inner sidewall of the bank BNK. Accordingly, the first capping pattern CLP1 may be disposed on the first electrode pattern CEP1 in the area other than the first to third emission areas EA1, EA2, and EA3.

The first inorganic layer TL1 may be disposed on the capping layer CAP of the first emission area EA1 and the first capping pattern CLP1. The first inorganic layer TL1 may cover the side surfaces of the first bank BNK1 surrounding the first emission area EA1. The first inorganic layer TL1 may include an inorganic material to prevent oxygen or moisture from permeating into the first light emitting element ED1. The first inorganic layer TL1 may be an inorganic encapsulation layer. In an embodiment, for example, the first inorganic layer TL1 may include at least one of a silicon nitride layer, a silicon oxynitride layer, a silicon oxide layer, a titanium oxide layer, an aluminum oxide layer, and an amorphous silicon layer, but is not limited thereto.

The second thin-film pattern AEP2 may include the same organic material as the fourth layer AE2*d* of the second pixel electrode AE2 and may be disposed on the first insulating layer IL1 and the first inorganic layer TL1. The second thin-film pattern AEP2 may cover side surfaces of the first insulating layer IL1, the second bank BNK2, the first thin-film pattern AEP1, the first organic pattern ELP1, the first electrode pattern CEP1, the first capping pattern CLP1, and the first inorganic layer TL1 adjacent to the second emission area EA2. The fourth layer AE2*d* of the second pixel electrode AE2 and the second thin-film pattern AEP2 may be deposited in the same process, and may be cut by the tip formed on the inner sidewall of the first insulating layer IL1 and the tip formed on the inner sidewall of the bank BNK. Accordingly, the second thin-film pattern AEP2 may be disposed on the first insulating layer IL1 in the area adjacent to the second emission area EA2 and on the first inorganic layer TL1 in areas adjacent to the second and third emission areas EA2 and EA3.

The second organic pattern ELP2 may include the same metal material as the second light emitting layer EL2 and may be disposed on the second thin-film pattern AEP2. The second organic pattern ELP2 may cover side surfaces of the second thin-film pattern AEP2 adjacent to the second emission area EA2. The second light emitting layer EL2 and the second organic pattern ELP2 may be deposited in the same process, but may be cut by the tip formed on the inner sidewall of the bank BNK. Accordingly, the second organic pattern ELP2 may be disposed on the second thin-film pattern AEP2 in the areas adjacent to the second and third emission areas EA2 and EA3.

The second electrode pattern CEP2 may include the same metal material as the second common electrode CE2 and may be disposed on the second organic pattern ELP2. The second electrode pattern CEP2 may cover side surfaces of the second organic pattern ELP2 adjacent to the second emission area EA2. The second common electrode CE2 and the second electrode pattern CEP2 may be deposited in the same process, but may be cut by the tip formed on the inner sidewall of the bank BNK. Accordingly, the second electrode pattern CEP2 may be disposed on the second organic pattern ELP2 in the areas adjacent to the second and third emission areas EA2 and EA3.

The second capping pattern CLP2 may include the same inorganic material as the capping layer CAP and may be disposed on the second electrode pattern CEP2. The second capping pattern CLP2 may cover side surfaces of the second electrode pattern CEP2 adjacent to the second emission area EA2. The capping layer CAP and the second capping pattern CLP2 may be deposited in the same process, but may be cut by the tip formed on the inner sidewall of the bank BNK. Accordingly, the second capping pattern CLP2 may be disposed on the second electrode pattern CEP2 in the areas adjacent to the second and third emission areas EA2 and EA3.

The second inorganic layer TL2 may be disposed on the capping layer CAP of the second emission area EA2 and the second capping pattern CLP2. The second inorganic layer TL2 may cover the side surfaces of the first bank BNK1 surrounding the second emission area EA2. The second inorganic layer TL2 may include an inorganic material to prevent oxygen or moisture from permeating into the second light emitting element ED2. The second inorganic layer TL2 may be an inorganic encapsulation layer. In an embodiment, for example, the second inorganic layer TL2 may be made of the material exemplified in the first inorganic layer TL1.

The third thin-film pattern AEP3 may include the same metal material as the fourth layer AE3*d* of the third pixel electrode AE3 and may be disposed on the first insulating layer IL1 and the second inorganic layer TL2. The third thin-film pattern AEP3 may cover side surfaces of the first insulating layer IL1, the second bank BNK2, the first thin-film pattern AEP1, the first organic pattern ELP1, the first electrode pattern CEP1, the first capping pattern CLP1, the first inorganic layer TL1, the second thin-film pattern AEP2, the second organic pattern ELP2, the second electrode pattern CEP2, the second capping pattern CLP2, and the second inorganic layer TL2 adjacent to the third emission area EA3. The fourth layer AE3*d* of the third pixel electrode AE3 and the third thin-film pattern AEP3 may be deposited in the same process, and may be cut by the tip formed on the inner sidewall of the first insulating layer IL1 and the tip formed on the inner sidewall of the bank BNK. Accordingly, the third thin-film pattern AEP3 may be disposed on the first insulating layer IL1 in an area adjacent to the third emission area EA3, and the second inorganic layer TL2 in an area adjacent to the third emission area EA3.

The third organic pattern ELP3 may include the same inorganic material as the third light emitting layer EL3 and may be disposed on the third thin-film pattern AEP3. The third organic pattern ELP3 may cover side surfaces of the third thin-film pattern AEP3 adjacent to the third emission area EA3. The third light emitting layer EL3 and the third organic pattern ELP3 may be deposited in the same process, but may be cut by the tip formed on the inner sidewall of the bank BNK. Accordingly, the third organic pattern ELP3 may be disposed on the third thin-film pattern AEP3 in the area adjacent to the third emission area EA3.

The third electrode pattern CEP3 may include the same metal material as the third common electrode CE3 and may be disposed on the third organic pattern ELP3. The third electrode pattern CEP3 may cover side surfaces of the third organic pattern ELP3 adjacent to the third emission area EA3. The third common electrode CE3 and the third electrode pattern CEP3 may be deposited in the same process, but may be cut by the tip formed on the inner sidewall of the bank BNK. Accordingly, the third electrode pattern CEP3 may be disposed on the third organic pattern ELP3 in the area adjacent to the third emission area EA3.

The third capping pattern CLP3 may include the same inorganic material as the capping layer CAP and may be disposed on the third electrode pattern CEP3. The third capping pattern CLP3 may cover side surfaces of the third electrode pattern CEP3 adjacent to the third emission area EA3. The capping layer CAP and the third capping pattern CLP3 may be deposited in the same process, but may be cut by the tip formed on the inner sidewall of the bank BNK. Accordingly, the third capping pattern CLP3 may be disposed on the third electrode pattern CEP3 in the area adjacent to the third emission area EA3.

The third inorganic layer TL3 may be disposed on the capping layer CAP of the third emission area EA3 and the third capping pattern CLP3. The third inorganic layer TL3 may cover the side surfaces of the first bank BNK1 surrounding the third emission area EA3. The third inorganic layer TL3 may include an inorganic material to prevent oxygen or moisture from permeating into the third light emitting element ED3. The third inorganic layer TL3 may be an inorganic encapsulation layer. In an embodiment, for example, the third inorganic layer TL3 may be made of the material exemplified in the first inorganic layer TL1.

The encapsulation layer TFEL may be disposed on the first to third inorganic layers TL1. TL2, and TL3 to cover the light emitting element layer EML. The encapsulation layer TFEL may include first and second encapsulation layers TFE1 and TFE2.

The first encapsulation layer TFE1 may be disposed on the first to third inorganic layers TL1, TL2, and TL3 to planarize an upper end of the light emitting element layer EML. The first encapsulation layer TFE1 may contain an organic material to protect the light emitting element layer EML from foreign substances such as dust. In an embodiment, for example, the first encapsulation layer TFE1 may include an organic film made of an acrylic resin, an epoxy resin, a phenolic resin, a polyamide resin, a polyimide resin, or the like. The first encapsulation layer TFE1 may be formed by curing a monomer or applying a polymer.

The second encapsulation layer TFE2 may be disposed on the first encapsulation layer TFE1. The second encapsulation layer TFE2 may include an inorganic material to prevent oxygen or moisture from permeating into the light emitting element layer EML. In an embodiment, for example, the second encapsulation layer TFE2 may include at least one of a silicon nitride layer, a silicon oxynitride layer, a silicon oxide layer, a titanium oxide layer, an aluminum oxide layer, and an amorphous silicon layer, but is not limited thereto.

The touch sensing unit TSU may be disposed on the encapsulation layer TFEL. The touch sensing unit TSU may include a third buffer layer BF3, a bridge electrode BRG, a second insulating layer IL2, touch electrodes TE, and a third insulating layer IL3.

The third buffer layer BF3 may be disposed on the encapsulation layer TFEL. The third buffer layer BF3 may have insulating and optical functions. The third buffer layer BF3 may include at least one inorganic film. Optionally, the third buffer layer BF3 may be omitted.

The bridge electrode BRG may be disposed on the third buffer layer BF3. The bridge electrode BRG may be disposed at a different layer from the touch electrode TE to electrically connect adjacent touch electrodes TE to each other.

The second insulating layer IL2 may be disposed on the bridge electrode BRG and the third buffer layer BF3. The second insulating layer IL2 may have insulating and optical functions. In an embodiment, for example, the second insulating layer IL2 may include at least one of a silicon nitride layer, a silicon oxynitride layer, a silicon oxide layer, a titanium oxide layer, an aluminum oxide layer, and an amorphous silicon layer, but is not limited thereto.

The touch electrodes TE may be disposed on the second insulating layer IL2. The touch electrode TE may include a driving electrode and a sensing electrode, and may sense a change in mutual capacitance between the driving electrode and the sensing electrode. The touch electrode TE may not overlap the first to third emission areas EA1, EA2, and EA3 in a plan view: The touch electrode TE may be formed as a single layer made of molybdenum (Mo), titanium (Ti), copper (Cu), aluminum (Al), or indium tin oxide (ITO) or be formed as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO.

The third insulating layer IL3 may be disposed on the touch electrodes TE and the second insulating layer IL2. The third insulating layer IL3 may have insulating and optical functions. The third insulating layer IL3 may be made of the material exemplified in the second insulating layer IL2.

The color filter layer CFL may be disposed on the touch sensing unit TSU. The color filter layer CFL may include a light blocking member BM, a plurality of color filters CF, and a planarization layer OC.

The light blocking member BM may be disposed on the third insulating layer IL3 and may surround first to third optical areas OPT1, OPT2, and OPT3. The light blocking member BM may overlap the touch electrodes TE in a plan view: The light blocking member BM may include a light absorbing material to prevent light reflection. In an embodiment, for example, the light blocking member BM may include an inorganic black pigment, an organic black pigment, or an organic blue pigment. The inorganic black pigment may be a metal oxide such as carbon black or titanium black, the organic black pigment may include at least one of lactam black, perylene black, and aniline black, and the organic blue pigment may be C.I. Pigment Blue, but the present disclosure is not limited thereto. The light blocking member BM may prevent color mixing due to permeation of visible light between the first to third emission areas EA1, EA2, and EA3 to improve a color gamut of the display device 10.

The plurality of color filters CF may include first to third color filters CF1, CF2 and CF3. The first to third color filters CF1, CF2 and CF3 may be disposed on the third insulating layer IL3 in line with the first to third emission areas EA1, EA2, and EA3, respectively.

The first color filter CF1 may be disposed in the first emission area EA1 on the third insulating layer IL3. The first color filter CF1 may be surrounded by the light blocking member BM in plan view: An edge of the first color filter CF1 may cover a portion of an upper surface of the light blocking member BM, but is not limited thereto. The first color filter CF1 may selectively transmit the light of the first color (e.g., the red light) therethrough and block or absorb the light of the second color (e.g., the green light) and the light of the third color (e.g., the blue light). In an embodiment, for example, the first color filter CF1 may be a red color filter and include a red colorant.

The second color filter CF2 may be disposed in the second emission area EA2 on the third insulating layer IL3. The second color filter CF2 may be surrounded by the light blocking member BM in plan view: An edge of the second color filter CF2 may cover a portion of the upper surface of the light blocking member BM, but is not limited thereto. The second color filter CF2 may selectively transmit the light of the second color (e.g., the green light) therethrough and block or absorb the light of the first color (e.g., the red light) and the light of the third color (e.g., the blue light). In an embodiment, for example, the second color filter CF2 may be a green color filter and include a green colorant.

The third color filter CF3 may be disposed in the third emission area EA3 on the third insulating layer IL3. The third color filter CF3 may be surrounded by the light blocking member BM in plan view: An edge of the third color filter CF3 may cover a portion of the upper surface of the light blocking member BM, but is not limited thereto. The third color filter CF3 may selectively transmit the light of the third color (e.g., the blue light) therethrough and block or absorb the light of the first color (e.g., the red light) and the light of the second color (e.g., the green light). In an embodiment, for example, the third color filter CF3 may be a blue color filter and include a blue colorant.

The first to third color filters CF1, CF2, and CF3 may absorb a portion of light introduced from the outside of the display device 10 to reduce reflected light due to external light. Accordingly, the first to third color filters CF1, CF2, and CF3 may prevent distortion of colors due to external light reflection.

The planarization layer OC may be disposed on the light blocking member BM and the first to third color filters CF1, CF2, and CF3. The planarization layer OC may planarize an upper end of the color filter layer CFL. In an embodiment, for example, the planarization layer OC may include an organic insulating material.

FIGS. 6 to 15 are cross-sectional views illustrating processes of manufacturing the display device according to an embodiment.

Figure 6:
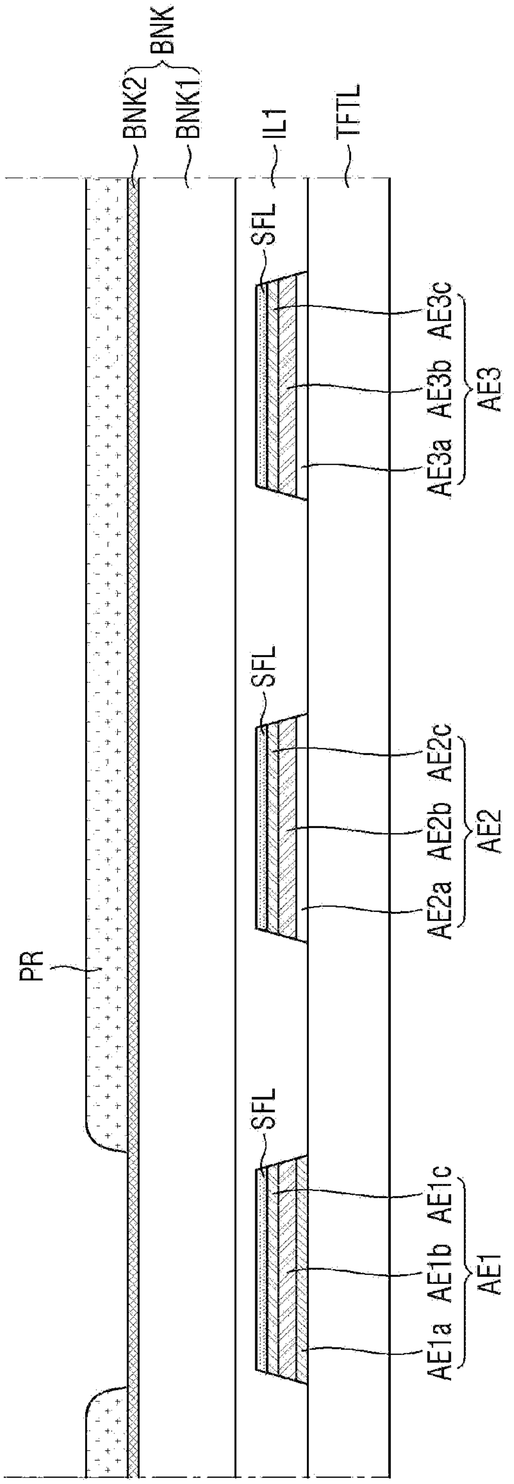
FIGS. 6 to 15 are cross-sectional views illustrating processes of manufacturing the display device according to an embodiment.

In FIG. 6, the first to third pixel electrodes AE1, AE2, and AE3 may be disposed to be spaced apart from each other on the thin-film transistor layer TFTL. Each of the first to third pixel electrodes AE1, AE2, and AE3 may be formed of or include multiple layers including different materials. The first pixel electrode AE1 may include first to third layers AE1*a*, AE1*b*, and AE1*c*. The second pixel electrode AE2 may include first to third layers AE2*a*, AE2*b*, and AE2*c*. The third pixel electrode AE3 may include the first to third layers AE3*a*, AE3*b*, and AE3*c*. The first layer AE1*a* of the first pixel electrode AE1 may be disposed on the thin-film transistor layer TFTL. The first layer AE1*a* of the first pixel electrode AE1 may include a material having high adhesion to the thin-film transistor layer TFTL and a material having high electrical conductivity. In an embodiment, for example, the first layer AE1*a* of the first pixel electrode AE1 may include ITO (Indium Tin Oxide), IZO (Indium Zinc Oxide), or ITZO (Indium Tin Zinc Oxide), but is not limited thereto.

The second layer AE1*b* of the first pixel electrode AE1 may be disposed on the first layer AE1*a*. The second layer AE1*b* of the first pixel electrode AE1 may include a material having high reflectivity. In an embodiment, for example, the second layer AE1*b* of the first pixel electrode AE1 may include silver (Ag), copper (Cu), aluminum (Al), nickel (Ni), or lanthanum (La), but is not limited thereto. The thickness of the second layer AE1*b* of the first pixel electrode AE1 may be greater than the thickness of the first layer AE1*a* or the thickness of the third layer AE1*c*.

The third layer AE1*c* of the first pixel electrode AE1 may be disposed on the second layer AE1*b*. Etching of the third layer AE1*c* of the first pixel electrode AE1 may be stopped in a dry etching process. The third layer AE1*c* of the first pixel electrode AE1 may protect the second layer AE1*b* during the manufacturing process of the display device 10. The third layer AE1*c* of the first pixel electrode AE1 may include an amorphous structure and can be easily and collectively etched together with the second layer AE1*b*. In an embodiment, for example, the third layer AE1*c* of the first pixel electrode AE1 may include indium gallium zinc oxide (IGZO), indium zinc oxide (IZO), or zinc-doped indium tin oxide (Zn-ITO), but the present disclosure is not limited thereto. Optionally, the third layer AE1*c* of the first pixel electrode AE1 may be omitted. The thickness of the third layer AE1*c* of the first pixel electrode AE1 may range from approximately 200 to 300 angstroms (Å), but is not limited thereto.

The first layer AE2*a* of the second pixel electrode AE2 and the first layer AE3*a* of the third pixel electrode AE3 may be formed of or include the same material as the first layer AE1*a* of the first pixel electrode AE1 at the same layer as the first layer AE1*a* of the first pixel electrode AE1. The second layer AE2*b* of the second pixel electrode AE2 and the second layer AE3*b* of the third pixel electrode AE3 may be formed of or include the same material as the second layer AE1*b* of the first pixel electrode AE1 at the same layer as the second layer AE1*b* of the first pixel electrode AE1. The third layer AE2*c* of the second pixel electrode AE2 and the third layer AE3*c* of the third pixel electrode AE3 may be formed of or include the same material as the third layer AE1*c* of the first pixel electrode AE1 at the same layer as the third layer AE1*c* of the first pixel electrode AE1.

A sacrificial layer SFL may be disposed on the first to third pixel electrodes AE1, AE2, and AE3. The sacrificial layer SFL may be disposed between upper surfaces of the first to third pixel electrodes AE1, AE2, and AE3 and the first insulating layer IL1. In an embodiment, for example, the sacrificial layer SFL may include molybdenum tantalum oxide (MoTaOx), but is not limited thereto. The sacrificial layer SFL may include a material soluble in water or tetra methyl ammonium hydroxide (TMAH). The solubility of the sacrificial layer SFL may be adjusted according to the composition ratio of tantalum, but is not limited thereto.

The thickness of the sacrificial layer SFL may be smaller than the thickness of the third layer AE1*c* of the first pixel electrode AE1. The sacrificial layer SFL may have a thickness of approximately 100 angstroms (Å) or less, but is not limited thereto.

The first insulating layer IL1 may be disposed on the thin-film transistor layer TFTL and the sacrificial layer SFL. The first insulating layer IL1 may include an inorganic insulating material. The first insulating layer IL1 may include at least one of a silicon nitride laver, a silicon oxynitride layer, a silicon oxide layer, a titanium oxide layer, an aluminum oxide layer, and an amorphous silicon layer, but is not limited thereto.

The bank BNK may include first to second banks BNK1 and BNK2. The first bank BNK1 may be disposed on the first insulating layer IL1, and the second bank BNK2 may be disposed on the first bank BNK1.

The first bank BNK1 and the second bank BNK2 may include metal materials different from each other. The first bank BNK1 may include a metal material having high electrical conductivity. The second bank BNK2 may include a metal material having low reflectivity. In an embodiment, for example, the first bank BNK1 may include aluminum (Al), and the second bank BNK2 may include titanium (Ti), but are not limited thereto.

A photoresist PR may be disposed not to overlap the first pixel electrode AE1 on the second bank BNK2 in a plan view: The photoresist PR may be provided except for an area where the first emission area EA1 is to be formed.

Figure 7:
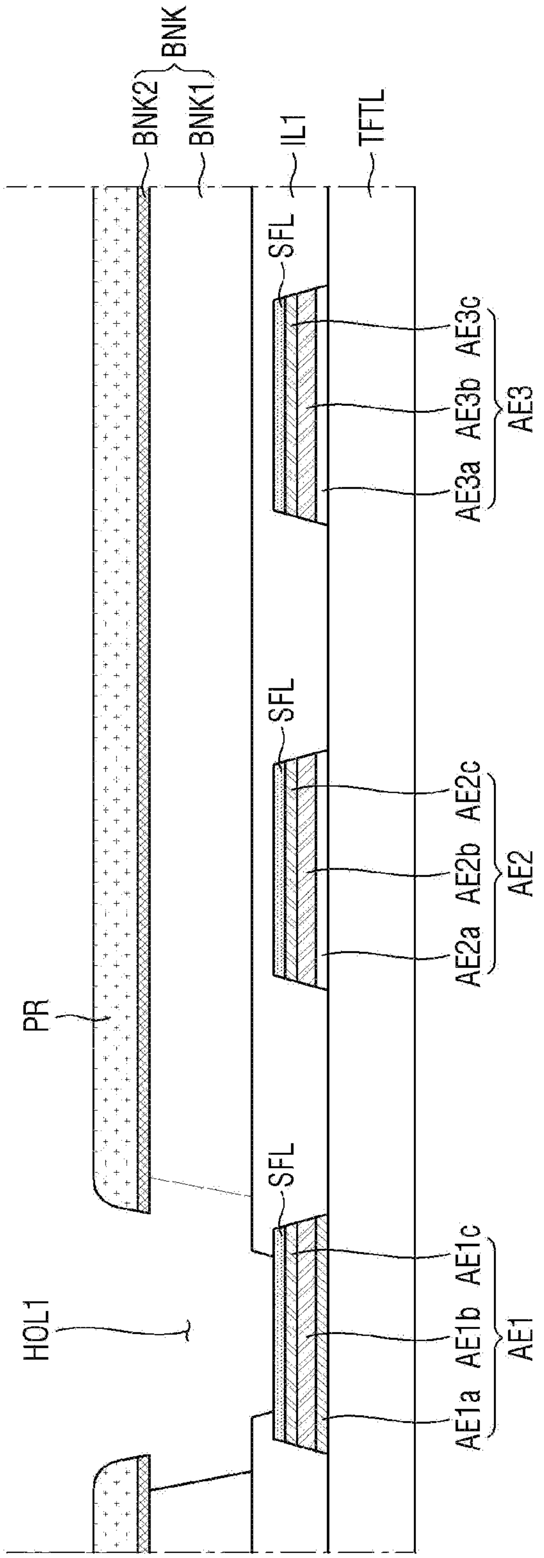

In FIG. 7, a first hole HOL1 may be formed by sequentially etching the bank BNK and the first insulating layer IL1. The first hole HOL1 may overlap the first emission area EA1 in a plan view:

The bank BNK may be etched by performing at least one of a dry etching process and a wet etching process. In an embodiment, for example, the bank BNK may be primarily etched through the dry etching process and secondarily etched through the wet etching process, but is not limited thereto. The first bank BNK1 and the second bank BNK2 may include metal materials different from each other. An etch rate of the first bank BNK1 may be different from an etch rate of the second bank BNK2. In a wet etching process, the etch rate of the first bank BNK1 may be higher than the etch rate of the second bank BNK2, and the first bank BNK1 may be etched more than the second bank BNK2. Accordingly, shapes of the side surfaces of the first and second banks BNK1 and BNK2 may be determined by a difference between the etch rates of the first and second banks BNK1 and BNK2. The second bank BNK2 may include a tip protruding from the first bank BNK1 toward the first hole HOL1. The side surface of the first bank BNK1 may have a shape in which it is recessed inward from the side surface of the second bank BNK2. A lower portion of the tip of the second bank BNK2 may have an undercut structure. The thickness of the first bank BNK1 may be greater than the thickness of the second bank BNK2.

The first insulating layer IL1 may be etched through a dry etching process, but is not limited thereto.

Figure 8:
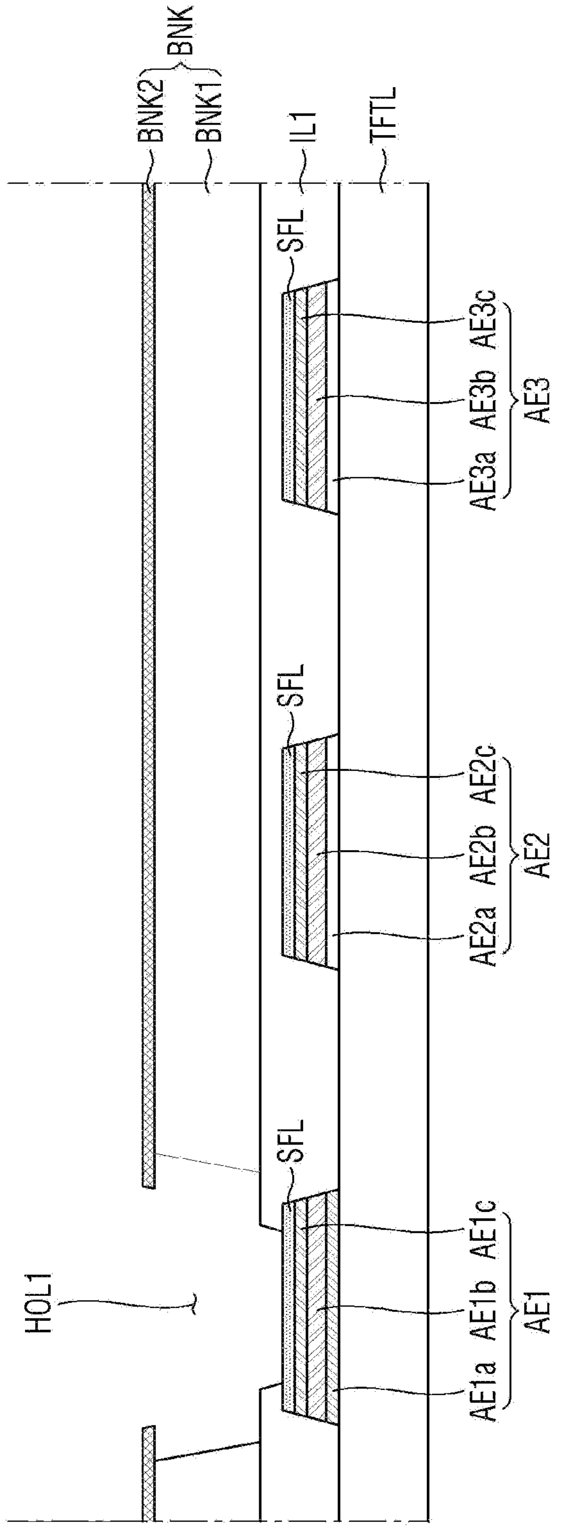

In FIG. 8, the photoresist PR may be removed through a strip process after the first hole HOL1 is formed.

Figure 9:
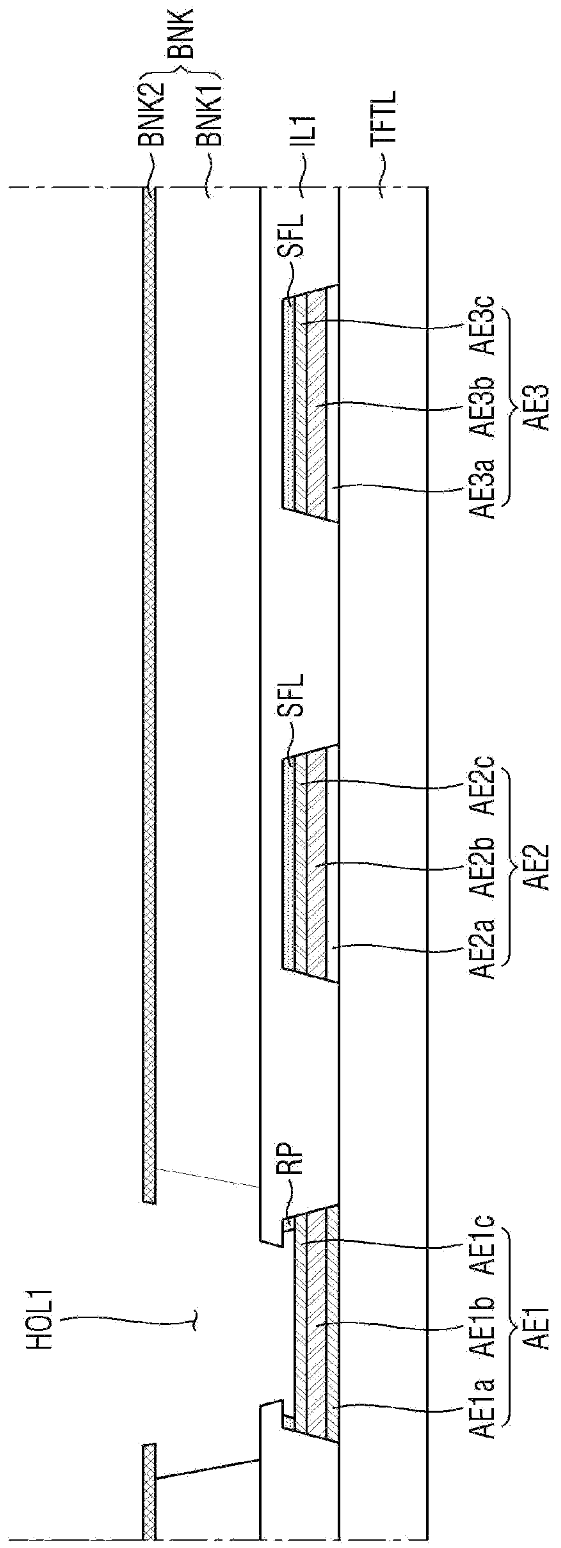

In FIG. 9, the sacrificial layer SFL may be partially removed through a cleaning process using water or tetra methyl ammonium hydroxide (TMAH). Accordingly, the sacrificial layer SFL may be partially removed without performing a separate wet etching process. As the sacrificial layer SFL is partially removed, at least a portion of the upper surface of the first pixel electrode AE1 may be exposed, and the residual pattern RP may remain between the first insulating layer IL1 and the first pixel electrode AE1. A side surface of the residual pattern RP may have a shape in which it is recessed inward from a side surface of the first insulating layer IL1.

Figure 10:
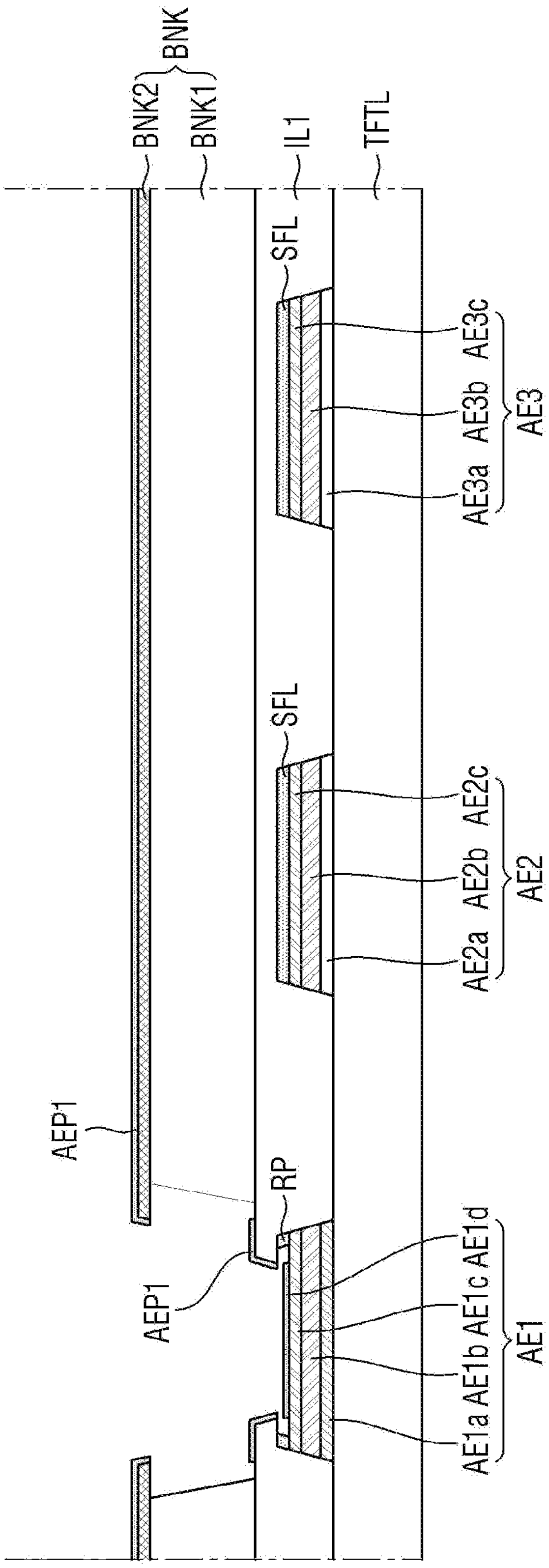

In FIG. 10, the fourth layer AE1*d* of the first pixel electrode AE1 and the first thin-film pattern AEP1 may be deposited in the same process and may be cut and separated from each other by the tip formed on the inner sidewall of the first insulating layer IL1 and the tip formed on the inner sidewall of the bank BNK (e.g., the second bank BNK2). The fourth layer AE1*d* of the first pixel electrode AE1 may be disposed on the third layer AE1*c*, and the first thin-film pattern AEP1 may be disposed on the first insulating layer IL1 and the second bank BNK2. The first thin-film pattern AEP1 may cover side surfaces of the first insulating layer IL1 and the side surfaces of the second bank BNK2 adjacent to the first emission area EA1. Accordingly, the first thin-film pattern AEP1 may be disposed on the first insulating layer IL1 in an area adjacent to the first emission area EA1, and may be disposed on the second bank BNK2 in an area other than the first emission area EA1.

The fourth layer AE1*d* of the first pixel electrode AE1 may be formed immediately before the first light emitting layer EL1 is deposited, so that the fourth layer AE1*d* may not be contaminated or damaged during the deposition and etching processes performed before the fourth layer AE1 is formed. In an embodiment, for example, when the third layer AE1*c* of the first pixel electrode AE1 includes indium gallium zinc oxide (IGZO), indium zinc oxide (IZO), or zinc-doped indium tin oxide (Zn-ITO), the upper surface of the third layer AE1*c* of the first pixel electrode AE1 may be contaminated or damaged in the deposition and etching process performed before the fourth layer AE1 is formed, and therefore zinc (Zn) may be diffused from the third layer AE1*c*. When zinc (Zn) is diffused on the upper surface of the third layer AE1*c* of the first pixel electrode AE1 and directly contacts the first light emitting layer EL1, light emission characteristics of the first light emitting element ED1 may be deteriorated. Here, the deterioration of light emission characteristics means that the current density flowing through the first pixel electrode AE1 is reduced compared to the voltage applied to the first pixel electrode AE1, and thus the luminous efficiency of the first light emitting element ED1 is reduced. However, in an embodiment, the fourth layer AE1*d* of the first pixel electrode AE1 may be disposed on the third layer AE1*c* before the first light emitting layer EL1 is deposited, thereby stably improving hole injection characteristics of the first pixel electrode AE1 and improving light emission characteristics. Therefore, the display device 10 may effectively improve display quality by including the fourth layer AE1*d*, which is the uppermost layer of the first pixel electrode AE1, without being contaminated or damaged during the manufacturing process of the display device 10. In an embodiment, for example, the fourth layer AE1*d* of the first pixel electrode AE1 and the first thin-film pattern AEP1 may include indium tin oxide (ITO), but is not limited thereto. In an embodiment, the fourth layer AE1*d* may not include zinc (Zn).

Figure 11:
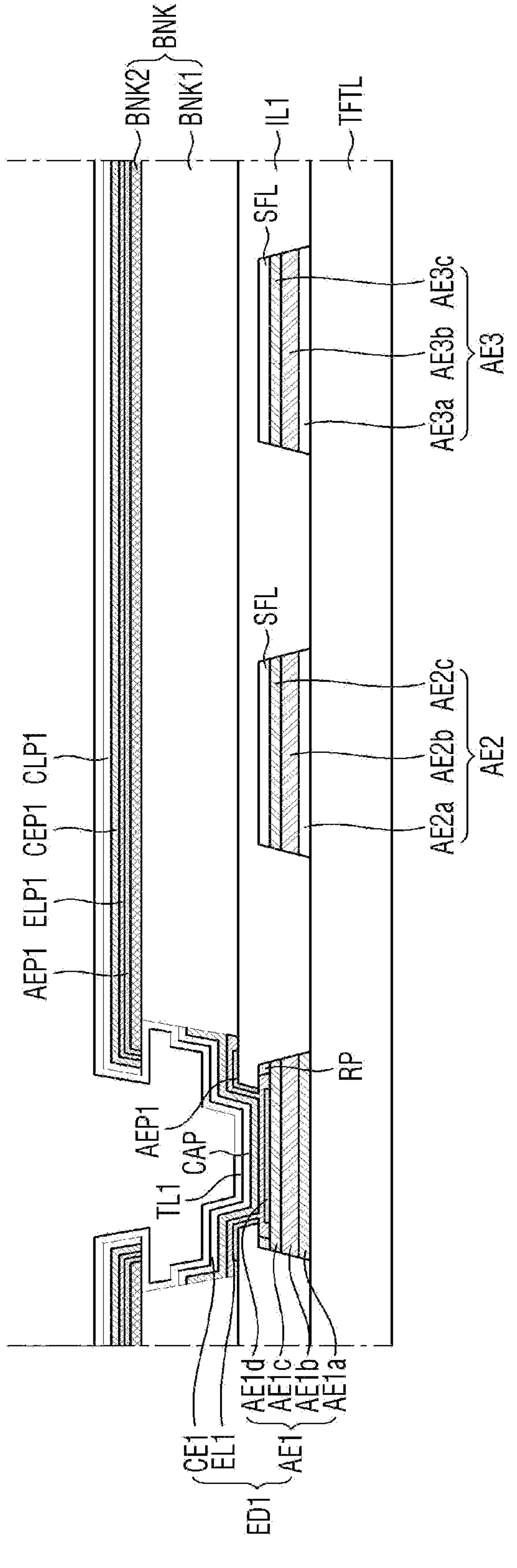

In FIG. 11, the first light emitting layer EL1 may be directly disposed on the first pixel electrode AE1 in the first emission area EA1. A portion of the first light emitting layer EL1 may be filled in a space surrounded by the first pixel electrode AE1, the residual pattern RP, and the first insulating layer IL1, and the other portion of the first light emitting layer EL1 may cover a first thin-film pattern AEP1 disposed on an upper surface and side surfaces of the first insulating layer IL1.

An organic material for forming the first light emitting layer EL1 and the first organic pattern ELP1 may be deposited on the entire surface of the display device 10. The first organic pattern ELP1 may include the same organic material as the first light emitting layer EL1 and may be disposed on the first thin-film pattern AEP1. The first organic pattern ELP1 may cover the side surface of the first thin-film pattern AEP1 adjacent to the first emission area EA1. The first light emitting layer EL1 and the first organic pattern ELP1 may be deposited in the same process, but may be cut by the tip formed on the inner sidewall of the bank BNK. Accordingly, the first organic pattern ELP1 may be disposed on the first thin-film pattern AEP1 in an area other than the first emission area EA1.

The first common electrode CE1 may be disposed on the first light emitting layer EL1. The first common electrode CE1 may include a transparent conductive material and may transmit light generated in the first light emitting layer EL1 therethrough. The first common electrode CE1 may be in contact with the side surfaces of the first bank BNK1. Accordingly, the first light emitting element ED1 may be formed in the first hole HOL1 and may emit the light through the first emission area EA1.

A metal material for forming the first common electrode CE1 and the first electrode pattern CEP1 may be deposited on the entire surface of the display device 10. The first electrode pattern CEP1 may include the same metal material as the first common electrode CE1 and may be disposed on the first organic pattern ELP1. The first electrode pattern CEP1 may cover side surfaces of the first organic pattern ELP1 adjacent to the first emission area EA1. The first common electrode CE1 and the first electrode pattern CEP1 may be deposited in the same process, but may be cut by the tip formed on the inner sidewall of the bank BNK. Accordingly, the first electrode pattern CEP1 may be disposed on the first organic pattern ELP1 in the area other than the first emission area EA1.

The capping layer CAP may be disposed on the first common electrode CE1. The capping layer CAP may include an inorganic insulating material and may cover the first light emitting element ED1. The capping layer CAP may prevent the first light emitting element ED1 from being damaged by external air. In an embodiment, for example, the capping layer CAP may include at least one of a silicon nitride layer, a silicon oxynitride layer, a silicon oxide layer, a titanium oxide layer, an aluminum oxide layer, and an amorphous silicon layer, but is not limited thereto.

An inorganic material for forming the capping layer CAP and the first capping pattern CLP1 may be deposited on the entire surface of the display device 10. The first capping pattern CLP1 may include the same inorganic material as the capping layer CAP and may be disposed on the first electrode pattern CEP1. The first capping pattern CLP1 may cover side surfaces of the first electrode pattern CEP1 adjacent to the first emission area EA1. The capping layer CAP and the first capping pattern CLP1 may be deposited in the same process, but may be cut by the tip formed on the inner sidewall of the bank BNK. Accordingly, the first capping pattern CLP1 may be disposed on the first electrode pattern CEP1 in the area other than the first emission area EA1.

The first inorganic layer TL1 may be disposed on the capping layer CAP of the first emission area EA1 and the first capping pattern CLP1. The first inorganic layer TL1 may cover the side surfaces of the first bank BNK1 surrounding the first emission area EA1. The first inorganic layer TL1 may include an inorganic material to prevent oxygen or moisture from permeating into the first light emitting element ED1. The first inorganic layer TL1 may be an inorganic encapsulation layer. In an embodiment, for example, the first inorganic layer TL1 may include at least one of a silicon nitride layer, a silicon oxynitride layer, a silicon oxide layer, a titanium oxide layer, an aluminum oxide layer, and an amorphous silicon layer, but is not limited thereto.

Figure 12:
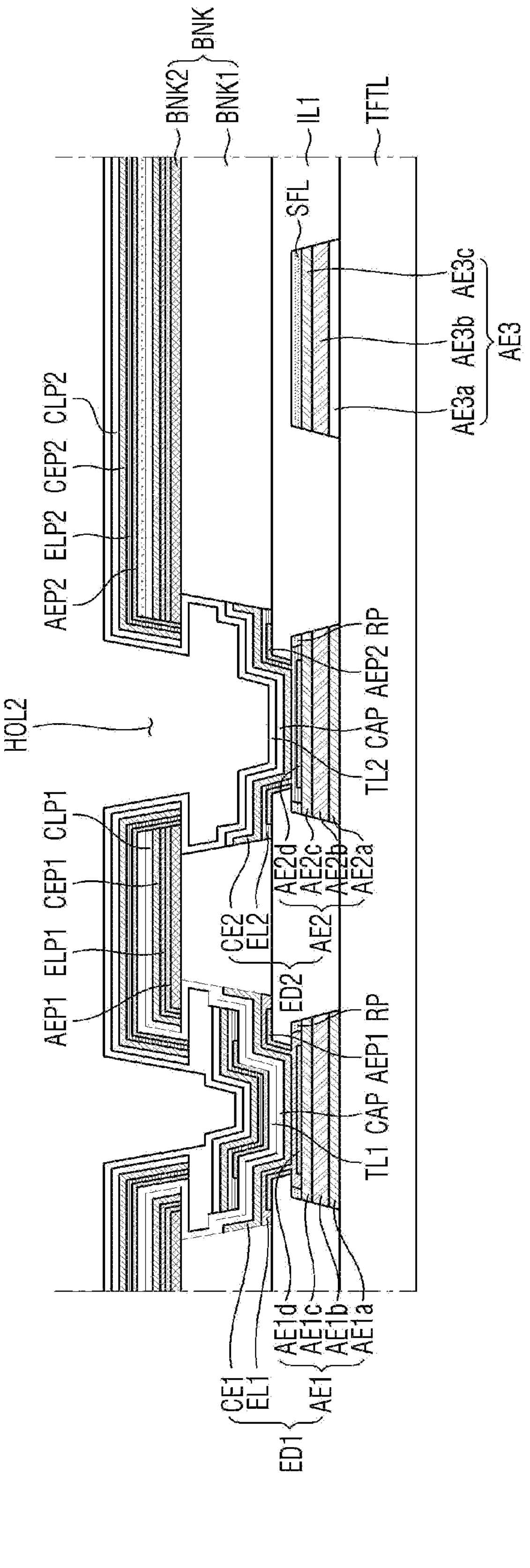

In FIG. 12, a second hole HOL2 may overlap the second emission area EA2 in a plan view: The second hole HOL2 may be formed by sequentially etching the first inorganic layer TL1, the first capping pattern CLP1, the first electrode pattern CEP1, the first organic pattern ELP1, the first thin-film pattern AEP1, the bank BNK, the first insulating layer IL1, and the sacrificial layer SFL. In a process of forming the second hole HOL2, the bank BNK, the first insulating layer IL1, and the sacrificial layer SFL may be etched in substantially the same manner as the processes described above with reference to FIGS. 6 to 9.

The fourth layer AE2*d* of the second pixel electrode AE2 and the second thin-film pattern AEP2 may be deposited in the same process, and may be cut by the tip formed on the inner sidewall of the first insulating layer IL1 and the tip formed on the inner sidewall of the bank BNK. The fourth layer AE2*d* of the second pixel electrode AE2 may be disposed on the third layer AE2*c*, and the second thin-film pattern AEP2 may be disposed on the first insulating layer IL1 and the first inorganic layer TL1. The second thin-film pattern AEP2 may cover side surfaces of the first insulating layer IL1, the second bank BNK2, the first thin-film pattern AEP1, the first organic pattern ELP1, the first electrode pattern CEP1, the first capping pattern CLP1, and the first inorganic layer TL1 adjacent to the second emission area EA2. Accordingly, the second thin-film pattern AEP2 may be disposed on the first insulating layer IL1 in the area adjacent to the second emission area EA2 and on the first inorganic layer TL1 in areas adjacent to the second emission area EA2.

The fourth layer AE2*d* of the second pixel electrode AE2 may be formed immediately before the second light emitting layer EL2 is deposited, so that it may not be contaminated or damaged during the deposition and etching processes. In an embodiment, for example, when the third layer AE2*c* of the second pixel electrode AE2 includes indium gallium zinc oxide (IGZO), indium zinc oxide (IZO), or zinc-doped indium tin oxide (Zn-ITO), the surface of the third layer AE2*c* of the second pixel electrode AE2 may be contaminated or damaged in the deposition and etching process, and zinc (Zn) may be diffused. When zinc (Zn) is diffused on the surface of the third layer AE2*c* of the second pixel electrode AE2 and directly contacts the second light emitting layer EL2, light emission characteristics of the second light emitting element ED2 may be deteriorated. The fourth layer AE2*d* of the second pixel electrode AE2 may be disposed on the third layer AE2*c* before the second light emitting layer EL2 is deposited, thereby stably improving hole injection characteristics of the second pixel electrode AE2 and improving light emission characteristics. Therefore, the display device 10 may improve display quality by including the fourth layer AE2*d*, which is the uppermost layer of the second pixel electrode AE2, without being contaminated or damaged during the manufacturing process of the display device 10. In an embodiment, for example, the fourth layer AE2*d* of the second pixel electrode AE2 and the second thin-film pattern AEP2 may include indium tin oxide (ITO), but is not limited thereto.

The second light emitting layer EL2 may be directly disposed on the second pixel electrode AE2 in the second emission area EA2. A portion of the second light emitting layer EL2 may be filled in a space surrounded by the second pixel electrode AE2, the residual pattern RP, and the first insulating layer IL1, and the other portion of the second light emitting layer EL2 may cover the second thin-film pattern AEP2 disposed on the upper surface and side surfaces of the first insulating layer IL1.

An organic material for forming the second light emitting layer EL2 and the second organic pattern ELP2 may be deposited on the entire surface of the display device 10. The second organic pattern ELP2 may include the same organic material as the second light emitting layer EL2 and may be disposed on the second thin-film pattern AEP2. The second organic pattern ELP2 may cover side surface of the second thin-film pattern AEP2 adjacent to the second emission area EA2. The second light emitting layer EL2 and the second organic pattern ELP2 may be deposited in the same process, but may be cut by the tip formed on the inner sidewall of the bank BNK. Accordingly, the second organic pattern ELP2 may be disposed on the second thin-film pattern AEP2 in an area other than the second emission area EA2.

The second common electrode CE2 may be disposed on the second light emitting layer EL2. The second common electrode CE2 may include a transparent conductive material and may transmit light generated in the second light emitting layer EL2 therethrough. The second common electrode CE2 may be in contact with the side surfaces of the first bank BNK1. Accordingly, the second light emitting element ED2 may be formed in the second hole HOL2 and may emit the light through the second emission area EA2.

A metal material for forming the second common electrode CE2 and the second electrode pattern CEP2 may be deposited on the entire surface of the display device 10. The second electrode pattern CEP2 may include the same metal material as the second common electrode CE2 and may be disposed on the second organic pattern ELP2. The second electrode pattern CEP2 may cover side surfaces of the second organic pattern ELP2 adjacent to the second emission area EA2. The second common electrode CE2 and the second electrode pattern CEP2 may be deposited in the same process, but may be cut by the tip formed on the inner sidewall of the bank BNK. Accordingly, the second electrode pattern CEP2 may be disposed on the second organic pattern ELP2 in the area other than the second emission area EA2.

The capping layer CAP may be disposed on the second common electrode CE2. The capping layer CAP may include an inorganic insulating material and may cover the second light emitting element ED2. The capping layer CAP may prevent the second light emitting element ED2 from being damaged by external air.

An inorganic material for forming the capping layer CAP and the second capping pattern CLP2 may be deposited on the entire surface of the display device 10. The second capping pattern CLP2 may include the same inorganic material as the capping layer CAP and may be disposed on the second electrode pattern CEP2. The second capping pattern CLP2 may cover side surfaces of the second electrode pattern CEP2 adjacent to the second emission area EA2. The capping layer CAP and the second capping pattern CLP2 may be deposited in the same process, but may be cut by the tip formed on the inner sidewall of the bank BNK. Accordingly, the second capping pattern CLP2 may be disposed on the second electrode pattern CEP2 in the area other than the second emission area EA2.

The second inorganic layer TL2 may be disposed on the capping layer CAP of the second emission area EA2 and the second capping pattern CLP2. The second inorganic layer TL2 may cover the side surfaces of the first bank BNK1 surrounding the second emission area EA2. The second inorganic layer TL2 may include an inorganic material to prevent oxygen or moisture from permeating into the second light emitting element ED2. The second inorganic layer TL2 may be an inorganic encapsulation layer. In an embodiment, for example, the second inorganic layer TL2 may be made of the material exemplified in the first inorganic layer TL1.

Figure 13:
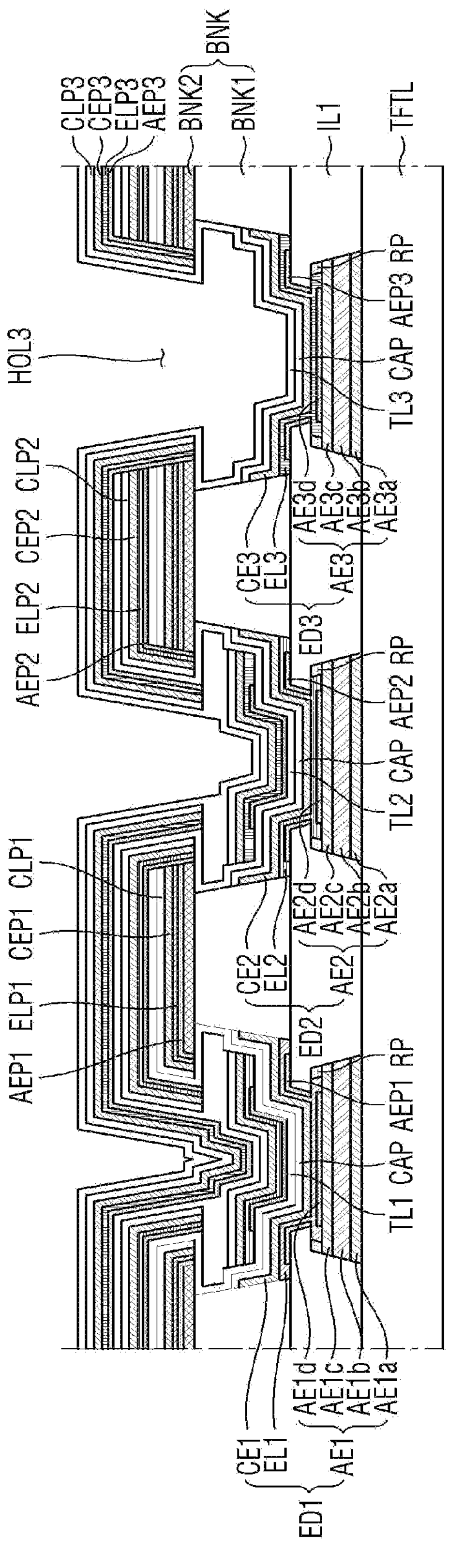

In FIG. 13, a third hole HOL3 may overlap the third emission area EA3 in a plan view. The third hole HOL3 may be formed by sequentially etching the second inorganic layer TL2, the second capping pattern CLP2, the second electrode pattern CEP2, the second organic pattern ELP2, the second thin-film pattern AEP2, the first inorganic layer TL1, the first capping pattern CLP1, the first electrode pattern CEP1, the first organic pattern ELP1, the first thin-film pattern AEP1, the bank BNK, the first insulating layer IL1, and the sacrificial layer SFL. In a process of forming the third hole HOL3, the bank BNK, the first insulating layer IL1, and the sacrificial layer SFL may be etched in substantially the same manner as the processes described above with reference to FIGS. 6 to 9.

The fourth layer AE3*d* of the third pixel electrode AE3 and the third thin-film pattern AEP3 may be deposited in the same process, and may be cut by the tip formed on the inner sidewall of the first insulating layer IL1 and the tip formed on the inner sidewall of the bank BNK. The fourth layer AE3*d* of the third pixel electrode AE3 may be disposed on the third layer AE3*c*, and the third thin-film pattern AEP3 may be disposed on the first insulating layer IL1 and the second inorganic layer TL2. The third thin-film pattern AEP3 may cover side surfaces of the first insulating layer IL1, the second bank BNK2, the first thin-film pattern AEP1, the first organic pattern ELP1, the first electrode pattern CEP1, the first capping pattern CLP1, the first inorganic layer TL1, the second thin-film pattern AEP2, the second organic pattern ELP2, the second electrode pattern CEP2, the second capping pattern CLP2, and the second inorganic layer TL2 adjacent to the third emission area EA3. Accordingly, third thin-film pattern AEP3 may be disposed on the first insulating layer IL1 in the area adjacent to the third emission area EA3 and on the second inorganic layer TL2 in areas other than the third emission area EA3.

The fourth layer AE3*d* of the third pixel electrode AE3 may be formed immediately before the third light emitting layer EL3 is deposited, so that it may not be contaminated or damaged during the deposition and etching processes. In an embodiment, for example, when the third layer AE3*c* of the third pixel electrode AE3 includes indium gallium zinc oxide (IGZO), indium zinc oxide (IZO), or zinc-doped indium tin oxide (Zn-ITO), the surface of the third layer AE3*c* of the third pixel electrode AE3 may be contaminated or damaged in the deposition and etching process, and zinc (Zn) may be diffused. When zinc (Zn) is diffused on the surface of the third layer AE3*c* of the third pixel electrode AE3 and directly contacts the third light emitting layer EL3, light emission characteristics of the third light emitting element ED3 may be deteriorated. The fourth layer AE3*d* of the third pixel electrode AE3 may be disposed on the third layer AE3*c* before the third light emitting layer EL3 is deposited, thereby stably improving hole injection characteristics of the third pixel electrode AE3 and improving light emission characteristics. Therefore, the display device 10 may improve display quality by including the fourth layer AE3*d*, which is the uppermost layer of the third pixel electrode AE3, without being contaminated or damaged during the manufacturing process of the display device 10. In an embodiment, for example, the fourth layer AE3*d* of the third pixel electrode AE3 and the third thin-film pattern AEP3 may include indium tin oxide (ITO), but is not limited thereto.

The third light emitting layer EL3 may be directly disposed on the third pixel electrode AE3 in the third emission area EA3. A portion of the third light emitting layer EL3 may be filled in a space surrounded by the third pixel electrode AE3, the residual pattern RP, and the first insulating layer IL1, and the other portion of the third light emitting layer EL3 may cover the third thin-film pattern AEP3 disposed on the upper surface and side surfaces of the first insulating layer IL1.

An organic material for forming the third light emitting layer EL3 and the third organic pattern ELP3 may be deposited on the entire surface of the display device 10. The third organic pattern ELP3 may include the same organic material as the third light emitting layer EL3 and may be disposed on the third thin-film pattern AEP3. The third organic pattern ELP3 may cover side surface of the third thin-film pattern AEP3 adjacent to the third emission area EA3. The third light emitting layer EL3 and the third organic pattern ELP3 may be deposited in the same process, but may be cut by the tip formed on the inner sidewall of the bank BNK. Accordingly, the third organic pattern ELP3 may be disposed on the third thin-film pattern AEP3 in an area other than the third emission area EA3.

The third common electrode CE3 may be disposed on the third light emitting layer EL3. The third common electrode CE3 may include a transparent conductive material and may transmit light generated in the third light emitting layer EL3 therethrough. The third common electrode CE3 may be in contact with the side surfaces of the first bank BNK1. Accordingly, the third light emitting element ED3 may be formed in the third hole HOL3 and may emit the light through the third emission area EA3.

A metal material for forming the third common electrode CE3 and the third electrode pattern CEP3 may be deposited on the entire surface of the display device 10. The third electrode pattern CEP3 may include the same metal material as the third common electrode CE3 and may be disposed on the third organic pattern ELP3. The third electrode pattern CEP3 may cover side surfaces of the third organic pattern ELP3 adjacent to the third emission area EA3. The third common electrode CE3 and the third electrode pattern CEP3 may be deposited in the same process, but may be cut by the tip formed on the inner sidewall of the bank BNK. Accordingly, the third electrode pattern CEP3 may be disposed on the third organic pattern ELP3 in the area other than the third emission area EA3.

The capping layer CAP may be disposed on the third common electrode CE3. The capping layer CAP may include an inorganic insulating material and may cover the third light emitting element ED3. The capping layer CAP may prevent the third light emitting element ED3 from being damaged by external air.

An inorganic material for forming the capping layer CAP and the third capping pattern CLP3 may be deposited on the entire surface of the display device 10. The third capping pattern CLP3 may include the same inorganic material as the capping layer CAP and may be disposed on the third electrode pattern CEP3. The third capping pattern CLP3 may cover side surfaces of the third electrode pattern CEP3 adjacent to the third emission area EA3. The capping layer CAP and the third capping pattern CLP3 may be deposited in the same process, but may be cut by the tip formed on the inner sidewall of the bank BNK. Accordingly, the third capping pattern CLP3 may be disposed on the third electrode pattern CEP3 in the area other than the third emission area EA3.

The third inorganic layer TL3 may be disposed on the capping layer CAP of the third emission area EA3 and the third capping pattern CLP3. The third inorganic layer TL3 may cover the side surfaces of the first bank BNK1 surrounding the third emission area EA3. The third inorganic layer TL3 may include an inorganic material to prevent oxygen or moisture from permeating into the third light emitting element ED3. The third inorganic layer TL3 may be an inorganic encapsulation layer. In an embodiment, for example, the third inorganic layer TL3 may be made of the material exemplified in the first inorganic layer TL1.

Figure 14:
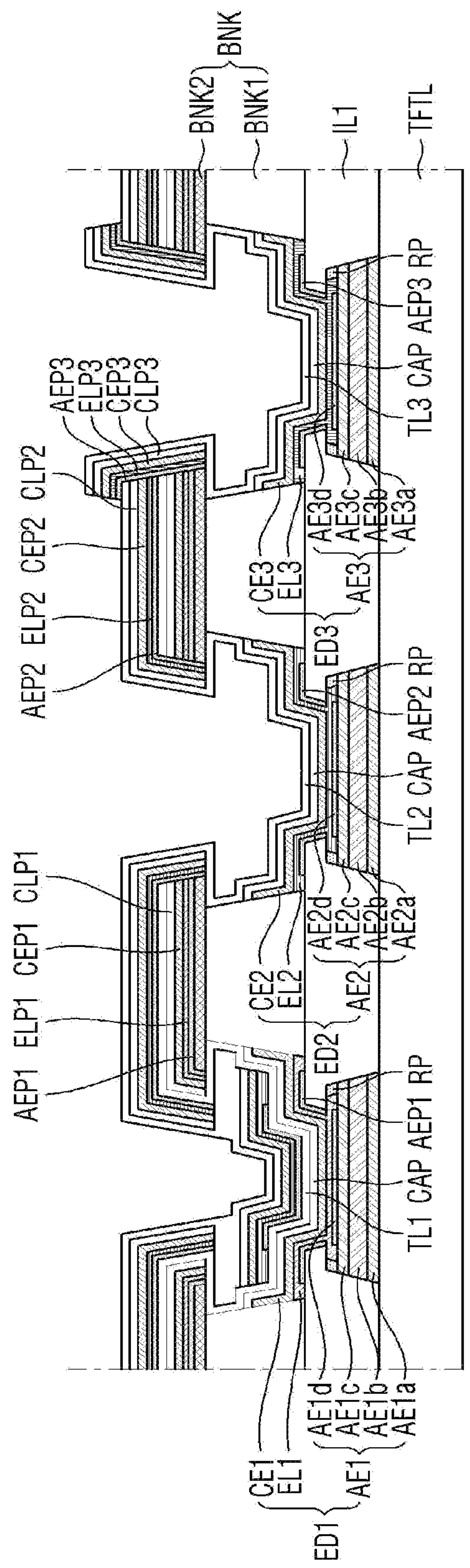

In FIG. 14, the third inorganic layer TL3, the third capping pattern CLP3, the third electrode pattern CEP3, the third organic pattern ELP3 and the third thin-film pattern AEP3 may be sequentially etched in the first emission area EA1 and an area adjacent to the first emission area EA1 and the second emission area EA2 and an area adjacent to the second emission area EA2. The third inorganic layer TL3, the third capping pattern CLP3, the third electrode pattern CEP3, the third organic pattern ELP3 and the third thin-film pattern AEP3 may remain in an area adjacent to the third emission area EA3. The third inorganic layer TL3, the third capping pattern CLP3, the third electrode pattern CEP3, the third organic pattern ELP3 and the third thin-film pattern AEP3 may be etched by performing at least one of a dry etching process and a wet etching process.

Figure 15:
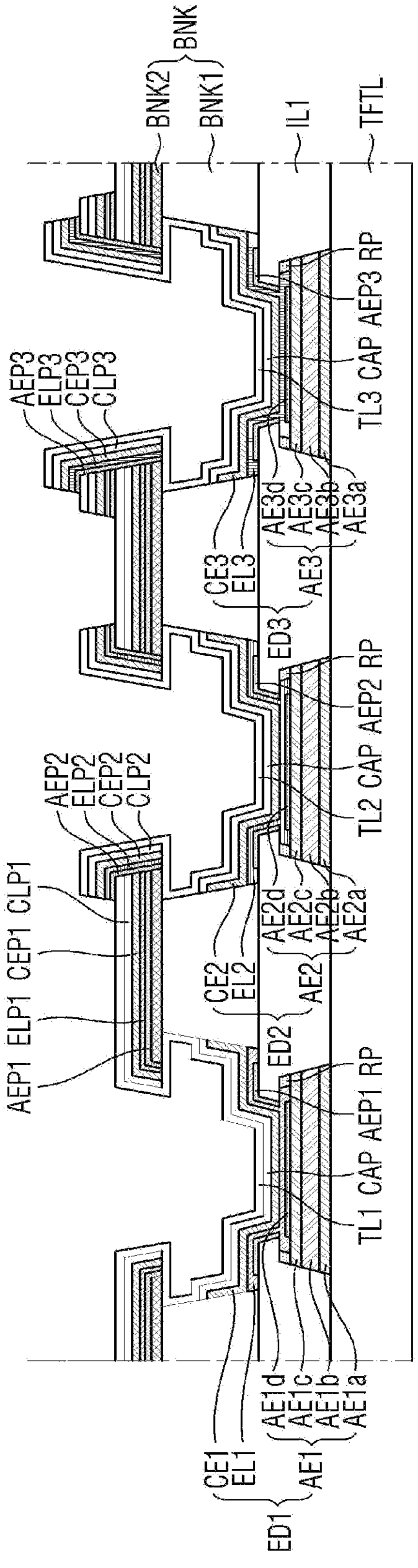

In FIG. 15, the second inorganic layer TL2, the second capping pattern CLP2, the second electrode pattern CEP2, the second organic pattern ELP2 and the second thin-film pattern AEP2 may be sequentially etched in the first emission area EA1 and an area adjacent to the first emission area EA1. The second inorganic layer TL2, the second capping pattern CLP2, the second electrode pattern CEP2, the second organic pattern ELP2 and the second thin-film pattern AEP2 may remain in an area adjacent to the second emission area EA2. The second inorganic layer TL2, the second capping pattern CLP2, the second electrode pattern CEP2, the second organic pattern ELP2 and the second thin-film pattern AEP2 may be etched by performing at least one of a dry etching process and a wet etching process.

What is claimed is:

1. A display device comprising:
a first pixel electrode disposed in a first emission area on a substrate and formed as multiple layers;
an insulating layer covering an edge of the first pixel electrode;
a first light emitting layer disposed on the first pixel electrode and the insulating layer;
a first common electrode disposed on the first light emitting layer;
a bank disposed on the insulating layer and surrounding the first emission area; and
a thin-film pattern disposed on the insulating layer and the bank in an adjacent area to the first emission area,
wherein an uppermost layer of the first pixel electrode and the thin-film pattern include the same material.

2. The display device of claim 1,
wherein the first pixel electrode comprises:
a first layer disposed in the first emission area of the substrate;
a second layer disposed on the first layer;
a third layer disposed on the second layer; and
a fourth layer disposed on the third layer to be the uppermost layer of the first pixel electrode.

3. The display device of claim 2,
wherein the first layer of the first pixel electrode includes indium tin oxide (ITO), indium zinc oxide (IZO), or indium tin zinc oxide (ITZO),
wherein the second layer of the first pixel electrode includes silver (Ag), copper (Cu), aluminum (Al), nickel (Ni), or lanthanum (La),
wherein the third layer of the first pixel electrode includes indium gallium zinc oxide (IGZO), indium zinc oxide (IZO), or zinc-doped indium tin oxide (Zn-ITO), and
wherein the fourth layer of the first pixel electrode includes indium tin oxide (ITO).

4. The display device of claim 2, further comprising residual patterns disposed between the insulating layer and an edge of the third layer of the first pixel electrode.

5. The display device of claim 4,
wherein the residual pattern includes molybdenum Tantalum Oxide (MoTaOx).

6. The display device of claim 4,
wherein a thickness of the residual pattern is greater than the thickness of the fourth layer of the first pixel electrode.

7. The display device of claim 1, further comprising:
an organic pattern formed of a same material in a same process as the first light emitting layer, and disposed on the thin-film pattern; and
an electrode pattern formed of a same material in a same process as the first common electrode, and disposed on the organic pattern.

8. The display device of claim 1,
wherein the bank comprises:

a first bank disposed on the insulating layer and including a metal material; and a second bank disposed on the first bank, wherein a side surface of the first bank is recessed inward from a side surface of the second bank.

9. The display device of claim 8, further comprising:

a second pixel electrode disposed in a second emission area on the substrate and formed as multiple layers;

a second light emitting layer disposed on the second pixel electrode and the insulating layer; and a second common electrode disposed on the second light emitting layer.

10. The display device of claim 9, wherein the first and second common electrodes are electrically connected to each other through the first bank.

11. A method of manufacturing a display device, comprising:

forming first and second pixel electrodes each including multiple layers on a substrate;

sequentially stacking a sacrificial layer, an insulating layer, and a bank on the first and second pixel electrodes;

forming a photoresist not overlapping the first pixel electrode on the bank in a plan view;

etching the bank and the insulating layer using the photoresist as a mask;

removing at least part of the sacrificial layer;

additionally forming an uppermost layer of the first pixel electrode on the first pixel electrode and forming a thin-film pattern on the insulating layer and the bank; and forming a light emitting layer on the uppermost layer of the first pixel electrode and forming an organic pattern on the thin-film pattern.

12. The method of manufacturing a display device of claim 11, wherein the removing of the part of the sacrificial layer includes removing the at least part of the sacrificial layer through a cleaning process using water or tetra methyl ammonium hydroxide (TMAH).

13. The method of manufacturing a display device of claim 11, wherein the sacrificial layer includes molybdenum Tantalum Oxide (MoTaOx).

14. The method of manufacturing a display device of claim 11, wherein the forming of the first pixel electrode including the multiple layers on the substrate comprises:

forming a first layer on a first emission area of the substrate;

forming a second layer on the first layer; and forming a third layer on the second layer;

wherein the forming of the uppermost layer of the first pixel electrode includes forming a fourth layer, which is the uppermost layer of the first pixel electrode, on the third layer.

15. The method of manufacturing a display device of claim 14, wherein the first layer of the first pixel electrode includes indium tin oxide (ITO), indium zinc oxide (IZO), or indium tin zinc oxide (ITZO), wherein the second layer of the first pixel electrode includes silver (Ag), copper (Cu), aluminum (Al), nickel (Ni), or lanthanum (La), wherein the third layer of the first pixel electrode includes indium gallium zinc oxide (IGZO), indium zinc oxide (IZO), or zinc-doped indium tin oxide (Zn-ITO), and wherein the fourth layer of the first pixel electrode includes indium tin oxide (ITO).

16. The method of manufacturing a display device of claim 11, wherein the etching of the bank and the insulating layer includes forming a tip protruding from an inner sidewall of the bank and a tip protruding from an inner sidewall of the insulating layer.

17. The method of manufacturing a display device of claim 16, wherein the forming of the uppermost layer of the first pixel electrode and the thin-film pattern includes cutting a metal material deposited on the substrate by the tip of the insulating layer and the tip of the bank to separate the metal material into the uppermost layer of the first pixel electrode and the thin-film pattern.

18. The method of manufacturing a display device of claim 16, wherein the forming of the light emitting layer and the organic pattern includes cutting an organic material deposited on the substrate by the tip of the bank to separate the organic material into the light emitting layer and the organic pattern.

19. The method of manufacturing a display device of claim 16, further comprising, after forming the light emitting layer and the organic pattern:

forming a common electrode on the light emitting layer and forming an electrode pattern on the organic pattern;

forming a capping layer on the common electrode and forming a capping pattern on the electrode pattern; and forming an inorganic layer covering side surfaces of the bank, the capping layer, and the capping pattern.

20. The method of manufacturing a display device of claim 19, wherein the forming of the common electrode and the electrode pattern includes cutting a metal material deposited on the substrate by the tip of the bank to separate the metal material into the common electrode and the electrode pattern.

* * * * *